United States Patent
Oh et al.

(10) Patent No.: US 11,456,283 B2
(45) Date of Patent: Sep. 27, 2022

(54) STACKED SEMICONDUCTOR DEVICE AND TEST METHOD THEREOF

(71) Applicant: SK hynix Inc., Gyeonggi-do (KR)

(72) Inventors: Sangmuk Oh, Gyeonggi-do (KR); Kangseol Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 273 days.

(21) Appl. No.: 16/910,803

(22) Filed: Jun. 24, 2020

(65) Prior Publication Data
US 2021/0193623 A1 Jun. 24, 2021

Related U.S. Application Data

(63) Continuation-in-part of application No. 16/890,190, filed on Jun. 2, 2020.

(30) Foreign Application Priority Data

Dec. 23, 2019 (KR) .................. 10-2019-0173005
Dec. 24, 2019 (KR) .................. 10-2019-0174014

(51) Int. Cl.
*G01R 31/02* (2006.01)
*G01R 31/26* (2020.01)
(Continued)

(52) U.S. Cl.
CPC ...... *H01L 25/0657* (2013.01); *G01R 31/2831* (2013.01); *G01R 31/2851* (2013.01);
(Continued)

(58) Field of Classification Search
CPC ............. H01L 25/0657; H01L 23/5384; H01L 23/5385; H01L 23/538; H01L 24/16;
(Continued)

(56) References Cited

U.S. PATENT DOCUMENTS

2008/0089146 A1  4/2008  Fujito et al.
2011/0103151 A1  5/2011  Kim et al.
(Continued)

FOREIGN PATENT DOCUMENTS

KR   10-2010-0100409 A    9/2010
KR   10-2015-0097074      8/2015
KR   10-2017-0025988      3/2017

OTHER PUBLICATIONS

Notice of Allowance issued by the USPTO dated Apr. 26, 2022.
Notice of Allowance issued by the USPTO for U.S. Appl. No. 16/928,157 dated Jun. 25, 2021.

*Primary Examiner* — Raul J Rios Russo
(74) *Attorney, Agent, or Firm* — IP & T Group LLP

(57) ABSTRACT

A stacked semiconductor device may include: a base die; and a plurality of core dies stacked over the base die and coupled to each other through a plurality of through-electrodes and a reference through-electrode, wherein the base die includes a first test circuit suitable for transferring a test oscillating signal to at least one target through-electrode among the through-electrodes, and outputting a test output signal by comparing a test base signal generated based on the test oscillating signal, with a test core signal transferred through the reference through-electrode, during a test operation; and wherein each of the core dies includes a second test circuit suitable for generating the test core signal corresponding to the test oscillating signal transferred through the target through-electrode, and transferring the test core signal to the reference through-electrode, during the test operation.

20 Claims, 18 Drawing Sheets

(51) Int. Cl.
*H01L 25/065* (2006.01)
*H01L 23/538* (2006.01)
*G01R 31/317* (2006.01)
*G01R 31/28* (2006.01)

(52) U.S. Cl.
CPC ..... *G01R 31/2884* (2013.01); *G01R 31/2886* (2013.01); *G01R 31/31717* (2013.01); *H01L 23/5384* (2013.01); *H01L 23/5385* (2013.01); *H01L 2924/00* (2013.01); *H01L 2924/0002* (2013.01); *H01L 2924/14* (2013.01)

(58) Field of Classification Search
CPC . H01L 2225/06513; H01L 2225/06541; H01L 25/0652; H01L 25/18; H01L 2924/00; H01L 2924/0002; H01L 2924/14; G01R 31/2851; G01R 31/31717; G01R 31/2856; G01R 31/2853; G01R 31/2884; G01R 31/2886; G01R 31/2831; G11C 5/025; G11C 29/025; G11C 29/40; G11C 29/702
USPC ...... 324/340, 361, 500, 537, 762.01, 762.03
See application file for complete search history.

(56) References Cited

U.S. PATENT DOCUMENTS

| | | | |
|---|---|---|---|
| 2012/0262196 A1* | 10/2012 | Yokou | G01R 31/318513 324/750.3 |
| 2014/0344612 A1* | 11/2014 | Yoko | G11C 29/025 713/400 |
| 2015/0270256 A1 | 9/2015 | Edwards et al. | |
| 2017/0309209 A1 | 10/2017 | Kenmotsu et al. | |
| 2018/0247876 A1* | 8/2018 | Kim | G11C 29/32 |
| 2019/0147790 A1 | 5/2019 | Chung et al. | |
| 2021/0294476 A1 | 9/2021 | Sasai et al. | |

* cited by examiner

STACKED SEMICONDUCTOR DEVICE AND TEST METHOD THEREOF

CROSS-REFERENCE TO RELATED APPLICATIONS

The present application is a Continuation-In-Part of application, and claims priority under 35 U.S.C. § 120 on, U.S. patent application Ser. No. 16/890,190, filed on Jun. 2, 2020, and claims priority under 35 U.S.C. § 119(a) to Korean Patent Application No. 10-2019-0173005, filed on Dec. 23, 2019, and Korean Patent Application No. 10-2019-0174014, filed on Dec. 24, 2019, which are herein incorporated by reference in their entirety.

BACKGROUND

1. Field

Various embodiments of the present invention relate to a semiconductor design technology, and more particularly, to a test method for a stacked semiconductor device to be stacked.

2. Description of the Related Art

With the rapid development of semiconductor technology, the packaging technology for semiconductor integrated devices has required high integration and high performance. Therefore, a variety of techniques for a three-dimensional (3D) structure in which a plurality of semiconductor chips are vertically stacked have been developed, in addition to a two-dimensional (2D) structure in which semiconductor chips having integrated circuits formed therein are two-dimensionally arranged on a printed circuit board (PCB) through wires or bumps.

Such a 3D structure can be implemented through a stacked semiconductor device in which a plurality of semiconductor chips are vertically stacked. The semiconductor chips stacked in the vertical direction may be mounted on a semiconductor package substrate while being electrically connected to each other through a plurality of through-electrodes, for example, through-silicon vias (TSVs).

In the TSVs, various types of defects may occur. The defects may include a void fail, a bump contact fail or a crack fail of the TSV. The void fail occurs when a TSV is not completely filled with a conductive material, and the bump contact fail occurs when a chip is bent or a bump material is moved. Faulty TSVs cannot electrically connect the plurality of chips. Therefore, any potential defects of the TSVs need to be detected using a test so that corrective action may be taken including replacing the faulty TSVs with non-faulty TSVs.

SUMMARY

Various embodiments of the present invention are directed to a stacked semiconductor device capable of verifying whether through-electrodes operate normally, at a wafer level, before the stacked semiconductor device is packaged with a controller.

Various embodiments of the present invention are directed to a stacked semiconductor device capable of testing the operational characteristics of through-electrodes according to a signal transmission rate.

Various embodiments of the present invention are directed to a stacked semiconductor device capable of testing only through-electrodes and interface circuits therefor.

In an embodiment, a stacked semiconductor device may include: a base die; and a plurality of core dies stacked over the base die and coupled to each other through a plurality of through-electrodes and a reference through-electrode, wherein the base die includes a first test circuit suitable for transferring a test oscillating signal to at least one target through-electrode among the through-electrodes, and outputting a test output signal by comparing a test base signal generated based on the test oscillating signal, with a test core signal transferred through the reference through-electrode, during a test operation; and wherein each of the core dies includes a second test circuit suitable for generating the test core signal corresponding to the test oscillating signal transferred through the target through-electrode, and transferring the test core signal to the reference through-electrode, during the test operation.

In an embodiment, a test method of a stacked semiconductor device including a base die and a plurality of core dies stacked over the base die and coupled to each other through a plurality of through-electrodes and a reference through-electrode, the test method may include: transferring, at the base die, a test oscillating signal to a target through-electrode among the through-electrodes, and generating a test base signal based on the oscillating signal; generating, at any of the core die, a test core signal based on the test oscillating signal transferred through the target through-electrode; and outputting, at the base die, a test output signal by comparing the test core signal transferred through the reference through-electrode, with the test base signal.

These and other features and advantages of the present invention will be better understood by those with ordinary skill in the field of the invention from the following detailed description of various embodiments of the invention in conjunction with the accompanying drawings.

DETAILED DESCRIPTION

Figure 1:
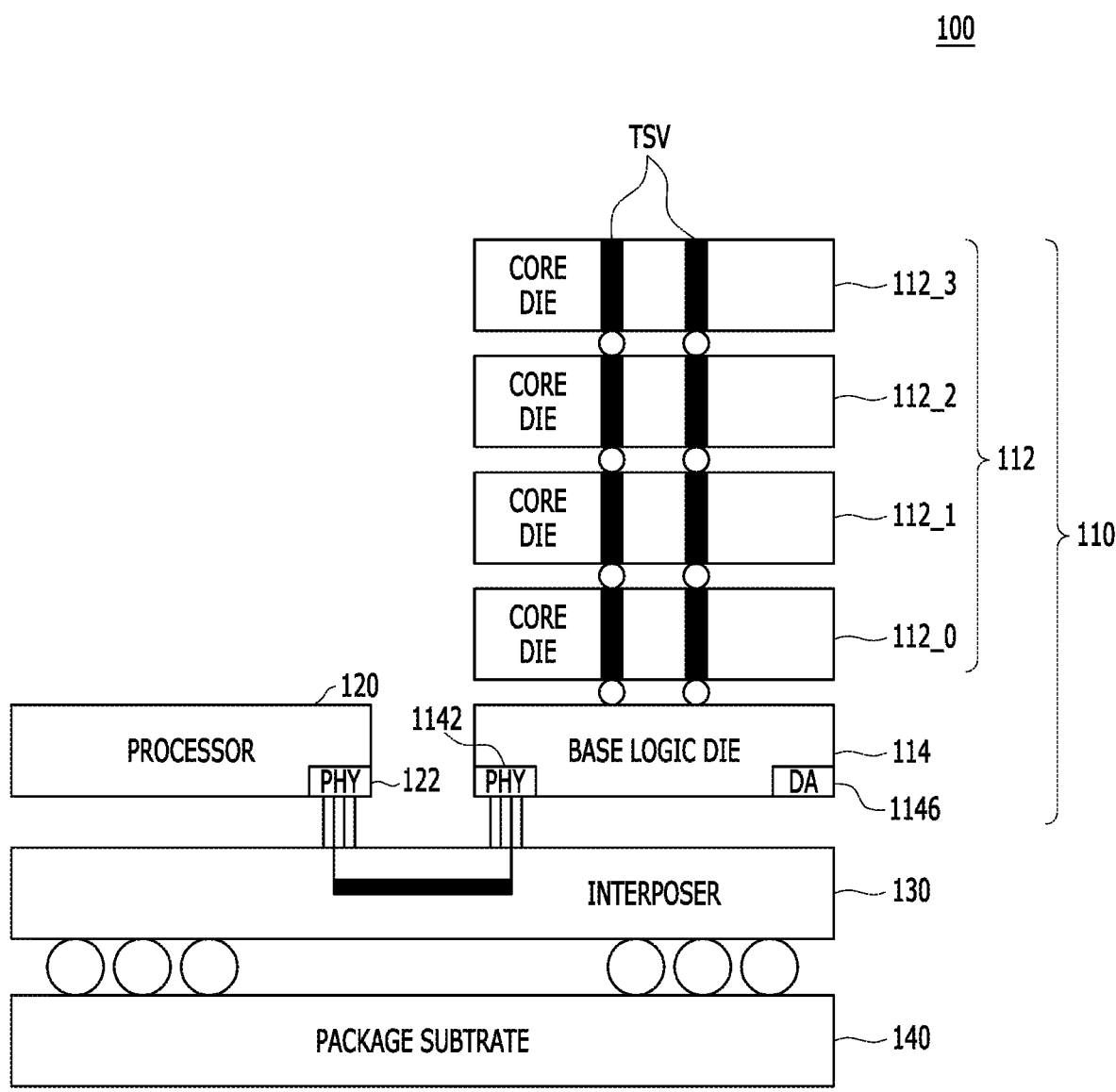
FIG. 1 is a cross-sectional diagram illustrating a semiconductor memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form if it is not specifically mentioned in a sentence.

Hereafter, a semiconductor memory system will be described as an example of a stacked semiconductor device. A semiconductor memory system in accordance with an embodiment may be implemented in the form of a system-in-package (SIP) module, multi-chip-package (MCP) module or system-on-chip (SoC) module, or implemented in the form of a package-on-package (PoP) module including a plurality of packages.

FIG. 1 is a diagram illustrating a semiconductor memory system 100 in accordance with an embodiment of the present invention.

Referring to FIG. 1, the memory system 100 may include a stacked memory device 110, and a controller 120. Since the controller 120 is generally included in diverse processors, such as a Central Processing Unit (CPU), a Graphic Processing Unit (GPU), and an Application Processor (AP), the controller 120 may be also referred to as a processor as designated in FIG. 1. The memory system 100 may also include an interposer 130 and a package substrate 140. The interposer 130 may be formed over the package substrate 140.

The stacked memory device 110 and the controller 120 may each be formed over the interposer 130. The stacked memory device 110 and the controller 120 may not overlap with each other vertically.

A physical area (PHY) 1142 of the stacked memory device 110 may be coupled to a physical area (PHY) 122 of the controller 120 via the interposer 130. An interface circuit for communication between the stacked memory device 110 and the controller 120 may be disposed in each of the physical areas 1142 and 122.

The stacked memory device 110 may form a High Bandwidth Memory (HBM). The HBM may have a high bandwidth corresponding to the increased number of I/O units obtained by stacking a plurality of dies (i.e., semiconductor chips) in a vertical direction and electrically connecting them through the through-electrodes TSVs.

The plurality of dies may include a base die 114 and a plurality of core dies 112. The core dies 112 may be stacked over the base die 114. The core dies 112 and the base die 114 may be coupled to each other through the through-electrodes TSVs. Although the embodiment of FIG. 1 shows a case where four core dies 112, that is, first to fourth core dies 112_0 to 112_3, are stacked, the concept and spirit of the present invention are not limited thereto and the number of the stacked core dies may vary depending on the design of the semiconductor device.

Each of the core dies 112 may be implemented with a memory chip. Each of the core dies 112 may include a plurality of memory cells for storing data and circuits for supporting a core operation on the memory cells. The base die 114 provides an interface between the core dies 112 and the controller 120 so that various functions within the semiconductor system 100, such as a memory management function (e.g., a refresh management function and a power management function for the memory cells), and a timing adjustment function between the core dies 112 and the controller 120, may be performed.

The base die 114 may include the physical area 1142 and a direct access area (DA) 1146. In the physical area 1142, an interface circuit for communication with the controller 120 may be disposed. In the direct access area 1146, an interface circuit for directly testing the stacked memory device 110 may be disposed. The base die 114 is also referred to as a buffer die, FIG. 2 is a perspective view of the stacked memory device 110 shown in FIG. 1 in accordance with an embodiment of the present invention.

Figure 2:
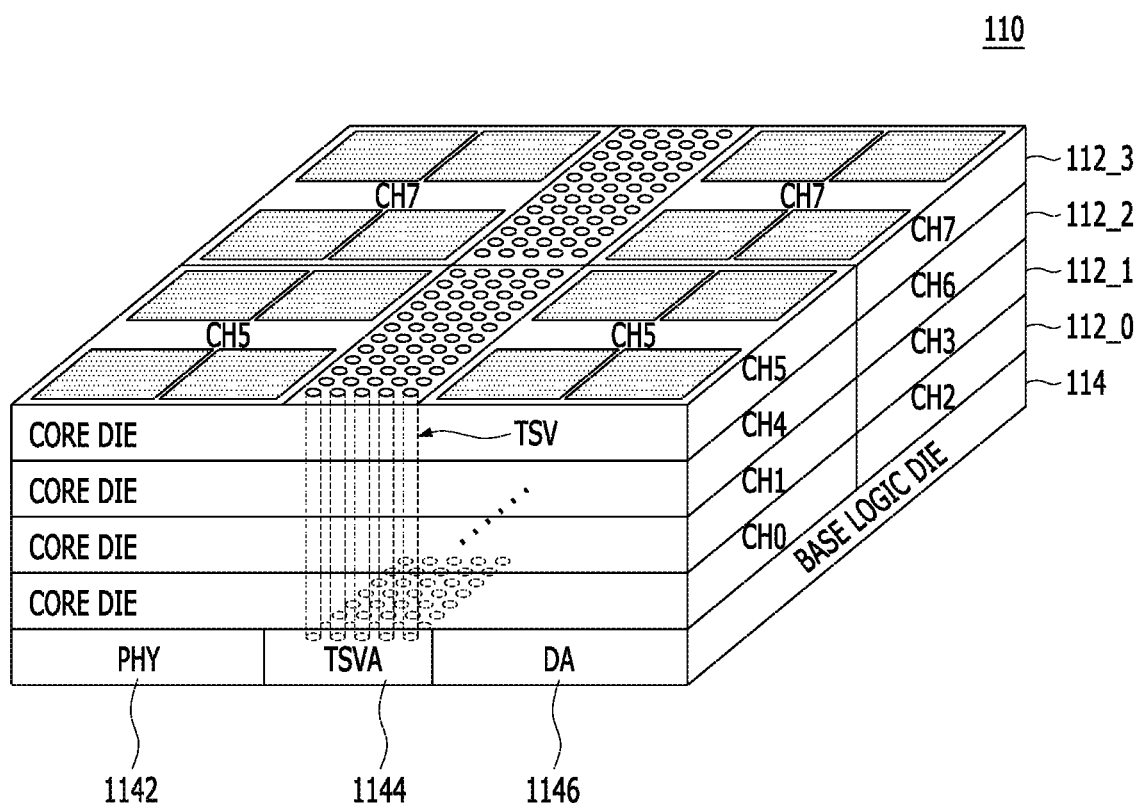
FIG. 2 is a perspective view illustrating a stacked memory device shown in FIG. 1 in accordance with an embodiment of the present invention.

Referring to FIG. 2, each of the first to fourth core dies 112_0 to 112_3 may include one or more channels. In the example of FIG. 2, each core die includes two channels and the stacked memory device 110 includes first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks may correspond to each channel. Further, a plurality of through-electrodes TSVs passing through the first to fourth core dies 112_0 to 112_3 may be disposed corresponding to the first to eighth channels CH0 to CH7, respectively. When each channel has a bandwidth of 128 bits (i.e., two 128-bit channels per die), the through-electrodes TSVs and corresponding I/O units may result into the stacked memory device 110 with a 1024-bit interface. Each channel may be similar to a standard DDR interface, but may be completely independent and therefore each channel within one stacked memory device and even within one die may operate at different frequency and/or different timings.

The base die 114 may communicate with the controller 120 (see FIG. 1). For example, the base die 114 may receive commands, addresses, and data from the controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base die 114.

The physical area 1142 may be provided with an I/O circuit for interfacing with the controller 120. The physical area 1142 may be disposed in a first edge area of the base die 114, adjacent to the controller 120. The direct access area 1146 may be provided with an I/O circuit for direct interfacing with an external test device (not shown). The direct access area 1146 may be disposed in a second edge area of the base die 114, adjacent to the external test device. The second edge area may be in a direction which is opposite to the first edge area. The TSV area 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at a central area of the base die 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 so as to transfer the buffered signals to the first to fourth core dies 112_0 to 112_3 through the through-electrodes TSVs.

Since the through-electrodes TSVs need to guarantee physical connections, the through-electrodes TSVs need to pass a test, for example, an open/short (OS) test. When defects are detected during the OS test which is performed on the through-electrodes TSVs connected in the column direction, the through-electrodes TSVs having the defects may be substituted with redundant through-electrodes.

Figure 3:
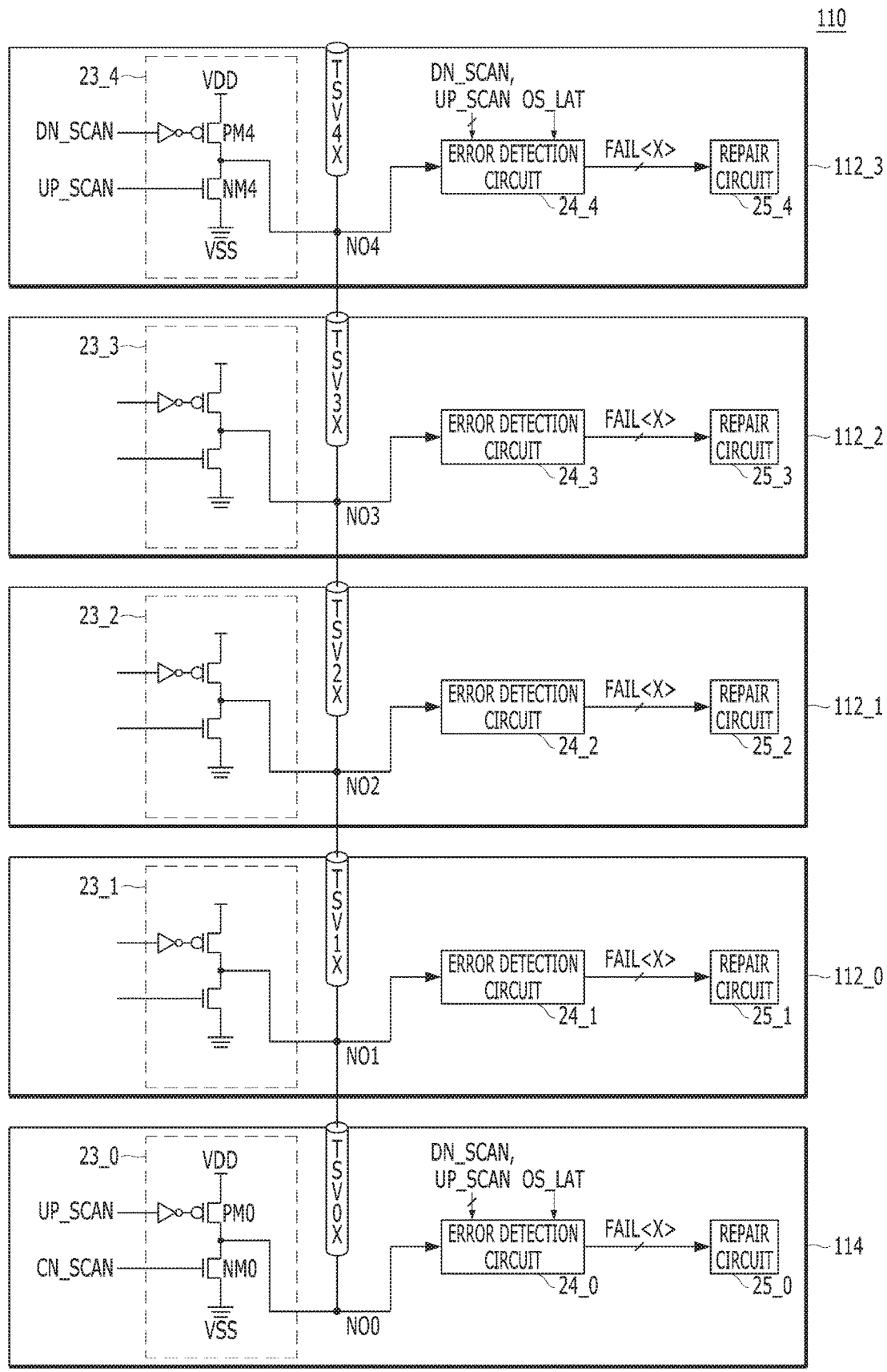
FIG. 3 is a diagram illustrating a configuration for testing a stacked semiconductor device in accordance with various embodiments of the present invention.

FIG. 3 is a diagram illustrating a configuration for testing the stacked semiconductor device 110 shown in FIG. 2.

Referring to FIG. 3, the stacked semiconductor device 110 may include a base logic die 114 and a plurality of core dies 112_0 to 112_3, which are stacked and communicate with channels allocated through a plurality of through-electrodes TSV0X to TSV4X. The core dies 112_0-112_3 may be stacked in a vertical direction as shown in FIG. 3. However, the core dies 112_0-112_3 may be stacked in a horizontal direction in another embodiment without departing from the scope of the present invention. For the convenience of description, though FIG. 3 illustrates through-electrodes TSV0X to TSV4X, one for each core die in the column direction, a plurality of through-electrodes may be formed for each core die.

The first to fourth core dies 112_0 to 112_3 may include through-electrode scan circuit 23_1 to and error detection circuits 24_1 to 24_4, respectively.

The through-electrode scan circuits 23_1 to 23_4 may perform a down-scan and an up-scan on the through-electrodes TSV0X to TSV4X connected in the column direction among the through-electrodes. The down-scan may indicate passing a signal in the downward direction through the through-electrodes TSV0X to TSV4X, and the up-scan may indicate passing a signal in the upward direction through the through-electrodes TSV0X to TSV4X. The error detection circuits 24_1 to 24_4 may detect whether the through-electrodes TSV0X to TSV4X have defects, based on the down-scan and the up-scan.

Each of the through-electrode scan circuits 23_1 to 23_4 may include a down-scan unit and an up-scan unit. The down-scan unit may perform the down-scan by flowing a current downward through the through-electrodes TSV0X to TSV4X connected in the column direction. The down-scan unit may include a current source PM4. The current source PM4 may provide a source current to one terminal NO1 to NO4 of the through-electrodes TSV1X to TSV4X in response to a down-scan signal DN_SCAN. The up-scan unit may perform the up-scan by flowing a current upward through the through-electrodes TSV0X to TSV4X connected in the column direction. The up-scan unit may include a current sink NM4. The current sink NM4 may sink signals transmitted through the terminals NO1 to NO4 of the through-electrodes TSV1X to TSV4X in response to an up-scan signal UP_SCAN. For reference, since the down-scan signal DN_SCAN and the up-scan signal UP_SCAN are activated to a logic high level, the down-scan unit may further include an inverter for driving the current source PM4 composed of a PMOS transistor.

The error detection circuits 24_1 to 24_4 may store a down-scan result as a first value according to the down-scan signal DN_SCAN and a latch signal OS_LAT, and may store an up-scan result as a second value according to the up-scan signal UP_SCAN and the latch signal OS_LAT. The error detection circuits 24_1 to 24_4 then may combine the stored first and second values to generate a fail determination signal FAIL<X> indicating whether the through-electrodes TSV0X to TSV4X have defects.

The base logic die 114 may include a through-electrode scan circuit 23_0 and an error detection circuit 24_0. The through-electrode scan circuit 23_0 may include a current sink NM0 and a current source PM0. The current sink NM0 may sink a signal transmitted in the downward direction through one terminal NO0 of the through-electrode TSV0X in response to the down-scan signal DN_SCAN. The current source PM0 may provide a source current corresponding to a signal transmitted in the upward direction to the terminal NO0 of the through-electrode TSV0X in response to the up-scan signal UP_SCAN. The current source PM0 of the base logic die 114 may be turned on in response to the up-scan signal UP_SCAN, while the current source PM4 of the first to fourth core dies 112_0 to 112_3 may be turned on in response to the down-scan signal DN_SCAN. Accordingly, the current source PM0 may complementarily operate to the current source PM4. Likewise, the current sink NM0 of the base logic die 114 may be turned on in response to the down-scan signal DN_SCAN, while the current sink NM4 of the first to fourth core dies 112_0 to 112_3 may be turned on in response to the up-scan signal UP_SCAN. Accordingly, the current sink NM0 may complementarily operate to the current sink NM4. The error detection circuit 24_0 may have substantially the same configuration as each of the error detection circuits 24_1 to 24_4 of the first to fourth core dies 112_0 to 112_3.

The base logic die 114 and the first to fourth core dies 112_0 to 112_3 may include repair circuits 25_0 to 25_4. The repair circuits 25_0 to 25_4 may detect defects of the through-electrodes TSV0X to TSV4X based on the fail determination signal FAIL<X>, and replace the detected defective through-electrodes with redundant through-electrodes (not shown).

During a boot-up operation or an initial operation, a chip identification (ID) signal may be allocated to each of the first to fourth core dies 112_0 to 112_3. For example, a chip ID signal of '00' may be allocated to the first core die 112_0, a chip ID signal of '01' may be allocated to the second core die 112_1, a chip ID signal of '10' may be allocated to the third core die 112_2, and a chip ID signal of '11' may be allocated to the fourth core die 112_3. According to an embodiment, using such a chip ID signal having stack information, the down-scan signal DN_SCAN and the up-scan signal UP_SCAN may be applied to the current source PM4 and the current sink NM4 included in a selected core die of the first to fourth core dies 112_0 to 112_3, while the current sources PM4 and the current sinks NM4 of unselected core dies may be floated.

Figure 4:
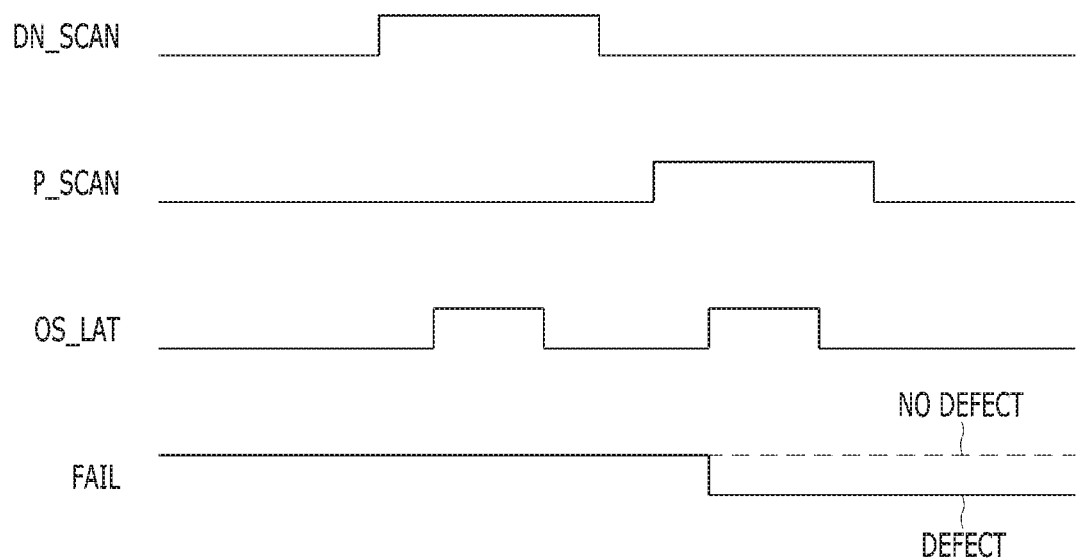
FIG. 4 is a timing diagram for describing an operation of an error detection circuit shown in FIG. 3 in accordance with various embodiments of the present invention.

FIG. 4 is a timing diagram for describing an operation of the error detection circuits 24_1 to 24_4 shown in FIG. 3.

Referring to FIG. 4, when the down-scan signal DN_SCAN is activated, the current source PM4 of the fourth core die 112_3 may provide a source current to one terminal NO4 of the through-electrode TSV4X, and the current sink NM0 of the base logic die 114 may sink a signal transmitted in the downward direction through one terminal NO0 of the through-electrode TSV0X. Thus, a down-scan for the through-electrode TSV0X to TSV4X may be performed. The error detection circuits 24_0 to 24_4 of each die may store the down-scan result as the first value according to the down-scan signal DN_SCAN and the latch signal OS_LAT.

When the up-scan signal UP_SCAN is activated, the current source PM0 of the base logic die 114 may provide a source current corresponding to a signal transmitted in the upward direction to the terminal NO0 of the through-electrode TSV0X, and the current sink NM4 of the fourth core die 112_3 may sink a signal transmitted through the terminal NO4 of the through-electrode TSV4X. Thus, an up-scan for the through-electrode TSV0X to TSV may be performed. The error detection circuits 24_0 to 24_4 of each die may store the up-scan result as the second value according to the up-scan signal UP_SCAN and the latch signal OS_LAT.

Finally, the error detection circuits 24_0 to 24_4 of each die may generate the fail determination signal FAIL<X> based on the first and second values. When any of the first and second values denotes that the through-electrodes TSV0X to TSV4X have defects, the error detection circuits 24_0 to 24_4 may output the fail determination signal FAIL<X> of a logic low level. If there is no defect in the through-electrodes TSV0X to TSV4X, the fail determination signal FAIL<X> may maintain a logic high level; otherwise the fail determination signal FAIL<X> may be deactivated to a logic low level. A test device (not illustrated), a controller (not illustrated) or the repair circuits 25_0 to 25_4 may determine whether the through-electrodes TSV0X to TSV4X have defects, based on the fail determination signal FAIL<X>.

As described above, the through-electrode scan circuits 23_0 to 23_4 and the error detection circuits 24_0 to 24_4 of each die may detect whether the through-electrodes TSV0X to TSV4X have defects by performing the down-scan and the up-scan on the through-electrodes TSV0X to TSV4X. However, when there is a defect in the error detection circuits 24_0 to 24_4, the fail determination signal FAIL<X> may be deactivated to a logic low level even if the through-electrodes TSV0X to TSV4X have no defect. In this case, an error analysis may become difficult and a chip manufacturing yield may be reduced due to an unnecessary repair.

Hereafter, a method capable of detecting/verifying an operation of an error detection circuit for performing a test for through-electrodes, before stacking a plurality of dies of a semiconductor device, will be described.

Figure 5:
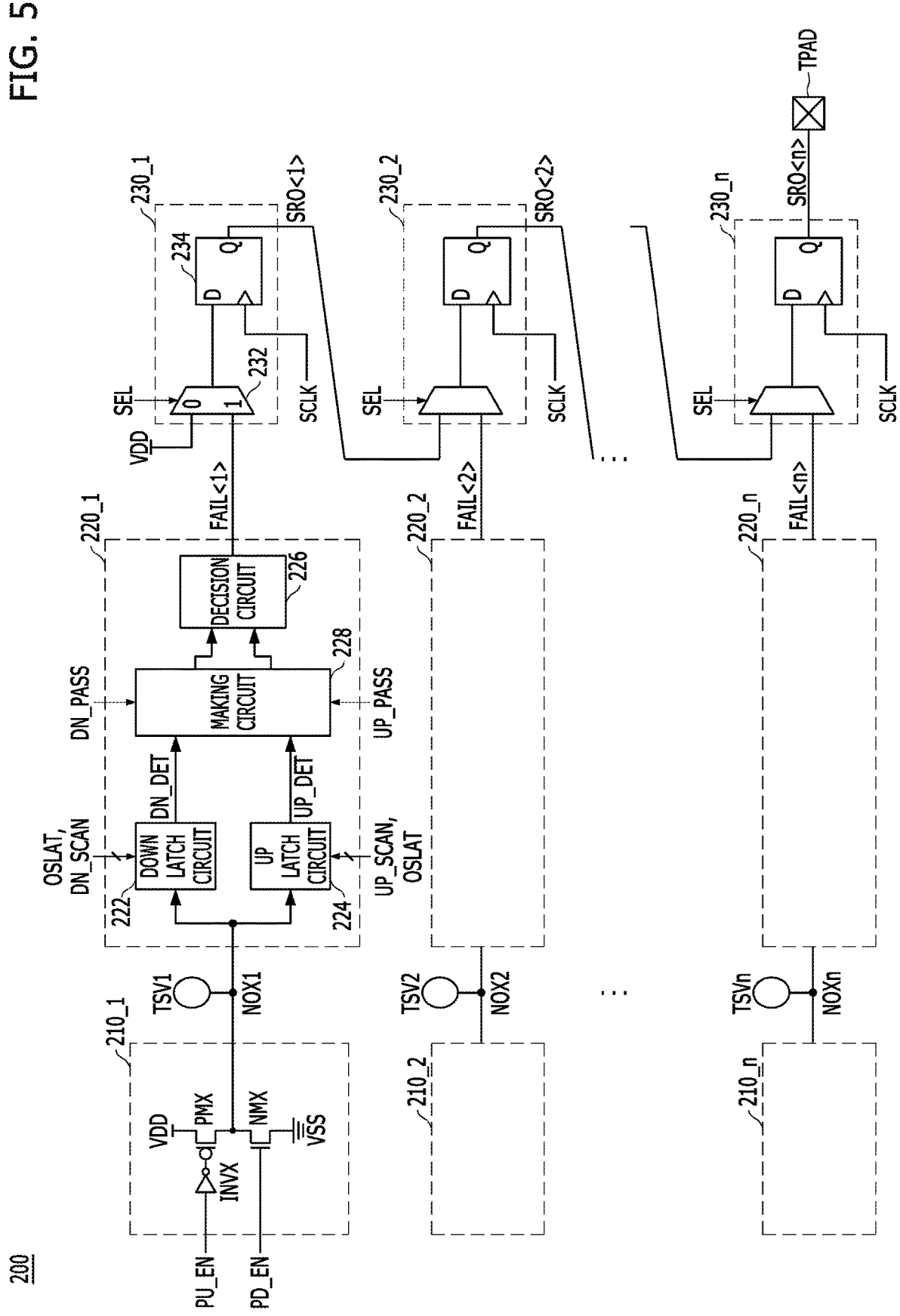
FIG. 5 is a circuit diagram illustrating a semiconductor device in accordance with various embodiments of the present invention.

FIG. 5 is a circuit diagram illustrating a semiconductor device 200 in accordance with various embodiments of the present invention. For reference, the semiconductor device 200 of FIG. 5 may correspond to each of the plurality of dies (i.e., the core dies and the base logic die) of FIGS. 1 to 3, before the dies are stacked. That is, the semiconductor device 200 of FIG. 5 may correspond to each of the dies at a wafer level.

Referring to FIG. 5, the semiconductor device 200 may include first to n-th through-electrodes TSV1 to TSVn, first to n-th through-electrode driving circuits 210_1 to 210_n, and first to n-th error detection circuits 220_1 to 220_n.

The first to n-th through-electrode driving circuits 210_1 to 210_n may be coupled to the first to n-th through-electrodes TSV1 to TSVn, respectively. Each of the first to n-th through-electrode driving circuits 210_1 to 210_n may be coupled to one terminal NOX1 to NOXn of a corresponding one of the first to n-th through-electrodes TSV1 to TSVn. The first to n-th through-electrode driving circuits 210_1 to 210_n may charge the first to n-th through-electrodes TSV1 to TSVn to a first voltage level (e.g., a supply voltage (VDD) level), or discharge the first to n-th through-electrodes TSV1 to TSVn to a second voltage level (e.g., a ground voltage (VSS) level).

In an embodiment, each of the first to n-th through-electrode driving circuits 210_1 to 210_n may include a pull-up driver PMX and a pull-down driver NMX. The pull-up driver PMX may pull up a corresponding through-electrode to the first voltage level according to a pull-up driving signal PU_EN. For example, the pull-up driver PMX may be implemented with a PMOS transistor which is coupled between a supply voltage (VDD) terminal and one terminal of the corresponding through-electrode, and has a gate for receiving the pull-up driving signal PU_EN. The pull-down driver NMX may pull down a corresponding through-electrode to the second voltage level according to a pull-down driving signal PD_EN. For example, the pull-down driver NMX may be implemented with an NMOS transistor which is coupled between one terminal of the corresponding through-electrode and a ground voltage (VSS) terminal, and has a gate for receiving the pull-down driving signal PD_EN. Preferably, since the pull-up driving signal PU_EN and the pull-down driving signal PD_EN are activated to a logic high level, each of the first to n-th through-electrode driving circuits 210_1 to 210_n may further include an inverter INVX for driving the pull-up driver PMX composed of a PMOS transistor.

For reference, the first to n-th through-electrode driving circuits 210_1 to 210_n may correspond to the through-electrode scan circuit (e.g., 23_0 to 23_4) of each die shown in FIG. 3 after stacking the dies. The pull-up driver PMX and the pull-down driver NMX may correspond to the current source (e.g., PM0 and PM4) and the current sink (e.g., NM0 and MM4) of each die shown in FIG. 3 after stacking the dies. That is, before stacking the dies, the first to n-th through-electrode driving circuits 210_1 to 210_n may pull up the corresponding through-electrode to the first voltage level, or may pull down the corresponding through-electrode to the second voltage level. After stacking the dies, the first to n-th through-electrode driving circuits 210_1 to 210_n may perform a down-scan and an up-scan on the through-electrodes (e.g., TSV0X to TSV4X) connected in the column direction as shown in FIG. 3.

The first to n-th error detection circuits 220_1 to 220_n may be coupled to the first to n-th through-electrodes TSV1 to TSVn, respectively. Each of the first to n-th error detection circuits 220_1 to 220_n may be coupled to one terminal NOX1 to NOXn of a corresponding through-electrode of the first to n-th through-electrodes TSV1 to TSVn. Each of the first to n-th error detection circuits 220_1 to 220_n may store the voltage level of a corresponding through-electrode of the first to n-th through-electrodes TSV1 to TSVn as a down-detection signal DN_DET and an up-detection signal UP_DET, and output a corresponding error detection signal of first to n-th error detection signals FAIL<1:n> by sequentially masking the down-detection signal DN_DET and the up-detection signal UP_DET.

In an embodiment, each of the first to n-th error detection circuits 220_1 to 220_n may include a down-latch circuit 222, an up-latch circuit 224, a decision circuit 226 and a masking circuit 228. The down-latch circuit 222 may store the voltage level of the corresponding through-electrode as the down-detection signal DN_DET in response to a down-scan signal DN_SCAN and a latch signal OS_LAT. The up-latch circuit 224 may store the voltage level of the corresponding through-electrode as the up-detection signal UP_DET in response to an up-scan signal UP_SCAN and the latch signal OS_LAT. The decision circuit 226 may generate the corresponding error detection signal based on the down-detection signal DN_DET and the up-detection signal UP_DET. The masking circuit 228 may provide the down-detection signal DN_DET and the up-detection signal UP_DET to the decision circuit 226 by sequentially masking the down-detection signal DN_DET outputted from the down-latch circuit 222 and the up-detection signal UP_DET outputted from the up-latch circuit 224. The masking circuit 228 may mask the down-detection signal DN_DET according to a down masking signal DN_PASS, and mask the up-detection signal UP_DET according to an up-masking signal UP_PASS. The down masking signal DN_PASS and the up-masking signal UP_PASS may be sequentially activated. A detailed description for the down-latch circuit 222, the up-latch circuit 224, the decision circuit 226 and the masking circuit 228 will be described with reference to FIG. 6.

For reference, the first to n-th error detection circuits 220_1 to 220_n may correspond to the error detection circuit (24_0 to 24_4) of each die shown in FIG. 3 after stacking the dies. After stacking the dies, the down masking signal DN_PASS and the up-masking signal UP_PASS may be maintained to a predefined logic level. Accordingly, after stacking the dies, the first to n-th error detection circuits 220_1 to 220_n may perform a defect detection operation on the through-electrodes TSV0X to TSV4X according to the down-scan and the up-scan, regardless of the down masking signal DN_PASS and the up-masking signal UP_PASS.

The semiconductor device 200 may further include first to n-th shifting circuits 230_1 to 230_n. The first to n-th shifting circuits 230_1 to 230_n may correspond to the first to n-th error detection circuits 220_1 to 220_n, respectively. Each of the first to n-th shifting circuits 230_1 to 230_n may be coupled to a corresponding error detection circuit of the first to n-th error detection circuits 220_1 to 220_n. Each of the first to n-th shifting circuits 230_1 to 230_n may store an error detection signal outputted from the corresponding error detection circuit or a shifting signal outputted from a previous-positioned shifting circuit, among first to n-th shifting signals SRO<1> to SRO<n>, and provide the stored signal as a shifting signal to a next-positioned shifting circuit, according to a selection signal SEL and a shifting clock SCLK. For reference, the first shifting circuit 230_1 positioned at a first stage among the first to n-th shifting circuits 230_1 to 230_n, may receive a signal of a source voltage (VDD) level, instead of the shifting signal.

In an embodiment, each of the first to n-th shifting circuits 230_1 to 230_n may include a selector 232 and a shifter 234. The selector 232 may select one of the error detection signal FAIL<Y> and the shifting signal SRO<Y−1> in response to the selection signal SEL. The error detection signal FAIL<Y> may be outputted from the corresponding error detection circuit 220_Y (1≤Y≤n), among the first to n-th error detection circuits 220_1 to 220_n. The shifting signal SRO<Y−1> may be outputted from the previous-positioned shifting circuit 230_Y−1, among the first to n-th shifting circuits 230_1 to 230_n. For example, the selector of the second shifting circuit 230_2 may select one of the second error detection signal FAIL<2> and the first shifting signal SRO<1> in response to the selection signal SEL. The selector of the second shifting circuit 230_2 may select the second error detection signal FAIL<2> when the selection signal SEL has a logic high level, and may select the first shifting signal SRO<1> when the selection signal SEL has a logic low level. The shifter 234 may latch an output of the selector 232 and provide the latched signal as the shifting signal to the next-positioned shifting circuit, in response to the shifting clock SCLK. Preferably, the shifter 234 may be implemented with a flip-flop. The n-th shifting circuit 230_n, positioned at a last stage among the first to n-th shifting circuits 230_1 to 230_n, may output the n-th shifting signal SRO<n> to an external device (or to the outside) through a test pad TPAD.

According to the above-described configuration, the first to n-th shifting circuits 230_1 to 230_n may sequentially output the first to n-th error detection signals FAIL<1:n> of the first to n-th error detection circuits 220_1 to 220_n as the n-th shifting signal SRO<n>, according to a toggling of the shifting clock SCLK. The n-th shifting signal SRO<n> may be outputted to an external test device (not shown) through the test pad TPAD.

Figure 6:
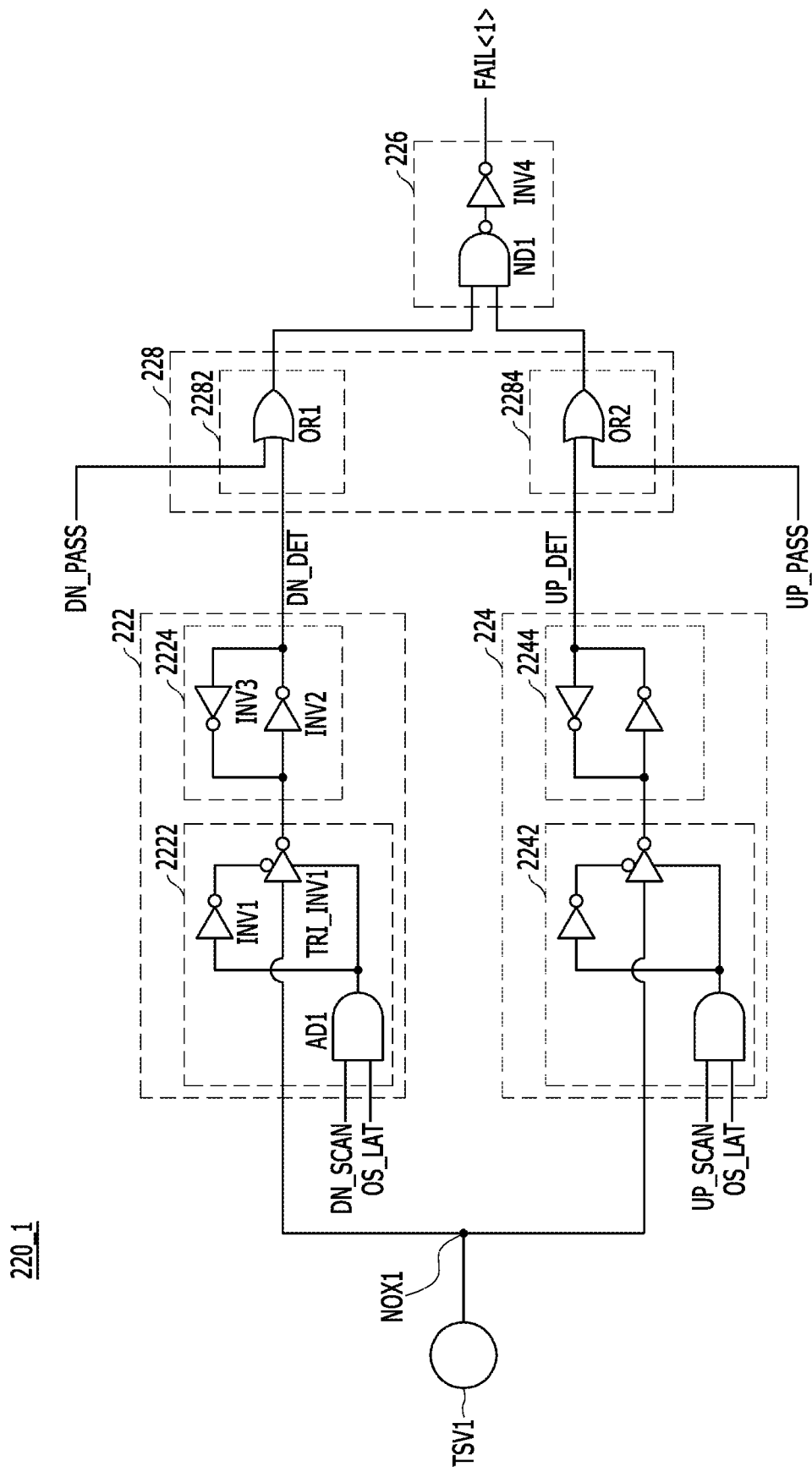
FIG. 6 is a detailed circuit diagram illustrating a first error detection circuit shown in FIG. 5 in accordance with various embodiments of the present invention.

FIG. 6 is a detailed circuit diagram illustrating the first error detection circuit 220_1 shown in FIG. 5. For reference, the second to n-th error detection circuits 220_2 to 220_n may have substantially the same configuration as the first error detection circuit 220_1.

Referring to FIG. 6, the down-latch circuit 222 of the first error detection circuit 220_1 may store the voltage level of the first through-electrode TSV1 as the down-detection signal DN_DET in response to the down-scan signal DN_SCAN and the latch signal OS_LAT. The down-latch circuit 222 may include a first transmitter 2222 and a first latch 2224. The first transmitter 2222 may transfer a signal provided from one terminal NOX1 of the first through-electrode TSV1, i.e., the voltage level of the first through-electrode TSV1 to the first latch 2224, based on the down-scan signal DN_SCAN and the latch signal OS_LAT. The first latch 2224 may latch the voltage level transferred from the first transmitter 2222 as the down-detection signal DN_DET.

For example, the first transmitter 2222 may include a first AND gate AD1, a first inverter INV1 and a first three-phase inverter TRI_INV1. The first AND gate AD1 may perform a logic AND operation on the down-scan signal DN_SCAN and the latch signal OS_LAT. The first inverter INV1 may invert an output of the first AND gate AD1. The first three-phase inverter TRI_INV1 may be enabled according to an output of the first AND gate AD1 and an output of the first inverter INV1, and invert the signal transmitted through the terminal NOX1 of the first through-electrode TSV1. The first latch 2224 may include cross-coupled inverters INV2 and INV3. According to the above-described configuration, the down-latch circuit 222 may store the signal provided from the terminal NOX1 of the first through-electrode TSV1 as the down-detection signal DN_DET, when both the down-scan signal DN_SCAN and the latch signal OS_LAT are activated.

The up-latch circuit 224 of the first error detection circuit 220_1 may store the voltage level of the first through-electrode TSV1 as the up-detection signal UP_DET in response to the up-scan signal UP_SCAN and the latch signal OS_LAT. The up-latch circuit 224 may include a second transmitter 2242 and a second latch 2244. The second transmitter 2242 may transfer a signal provided from one terminal NOX1 of the first through-electrode TSV1, i.e., the voltage level of the first through-electrode TSV1 to the second latch 2224, based on the up-scan signal UP_SCAN and the latch signal OS_LAT. The second latch 2244 may latch the voltage level transferred from the second transmitter 2242 as the up-detection signal UP_DET. The second transmitter 2242 and the second latch 2244 may have substantially the same configurations as the first transmitter 2222 and the first latch 2224, respectively. According to the above-described configuration, the up-latch circuit 224 may store the signal provided from the terminal NOX1 of the first through-electrode TSV1 as the up-detection signal UP_DET, when both the up-scan signal UP_SCAN and the latch signal OS_LAT are activated.

The decision circuit 226 of the first error detection circuit 220_1 may generate the first error detection signal FAIL<1> by combining the down-detection signal DN_DET outputted from the down-latch circuit 222 and the up-detection signal UP_DET outputted from the up-latch circuit 224. For example, the decision circuit 226 may include a NAND gate ND1 which performs a logic NAND operation on the down-detection signal DN_DET and the up-detection signal UP_DET to output the first error detection signal FAIL<1>.

The masking circuit 228 of the first error detection circuit 220_1 may sequentially mask the down-detection signal DN_DET outputted from the down-latch circuit 222 and the up-detection signal UP_DET outputted from the up-latch circuit 224. The masking circuit 228 may include a down masking circuit 2282 and an up-masking circuit 2284. The down masking circuit 2282 may mask the down-detection signal DN_DET according to the down masking signal DN_PASS. The up-masking circuit 2284 may mask the up-detection signal UP_DET according to the up-masking signal UP_PASS. Preferably, the down masking circuit 2282 and the up-masking circuit 2284 may be implemented with first and second OR gates OR1 and OR2, respectively. That is, the down masking circuit 2282 may mask the down-detection signal DN_DET to a logic high level when the down masking signal DN_PASS has a logic high level, and output the down-detection signal DN_DET when the down masking signal DN_PASS has a logic low level. The up-masking circuit 2284 may mask the up-detection signal UP_DET when the up-masking signal UP_PASS has a logic high level, and output the up-detection signal UP_DET when the up-masking signal UP_PASS has a logic low level. After stacking the dies (or the semiconductor devices), the down masking signal DN_PASS and the up-masking signal UP_PASS may be maintained to a logic low level, thereby preventing the masking operation from being performed by the masking circuit 228.

Before the stacking, the first to n-th error detection circuits 220_1 to 220_n may generate the first to n-th error detection signals FAIL<1:n> indicating whether the down-latch circuit 222 or the up-latch circuit 224 has defects. Further, after the stacking, the first to n-th error detection circuits 220_1 to 220_n may generate the first to n-th error detection signals FAIL<1:n> indicating whether the through-electrodes TSV0X to TSV4X (of FIG. 3) have defects, based on the down-scan and up-scan operations on the through-electrodes TSV0X to TSV4X connected in the column direction.

Hereinafter, referring to FIGS. 5 to 8, a test operation of the semiconductor device 200 in accordance with the present embodiment will be described.

Figure 7:
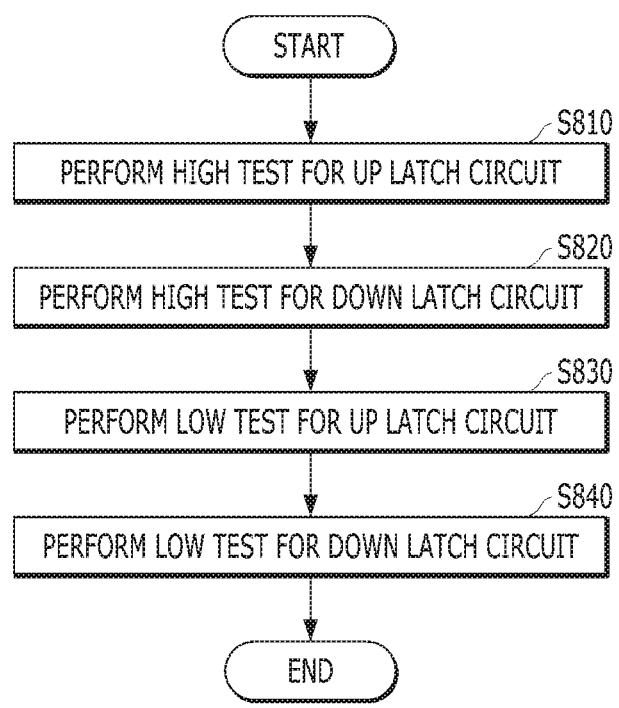
FIGS. 7 and 8 are a flow chart and a timing diagram for describing a test operation of a semiconductor device in accordance with various embodiments of the present invention.
Figure 8:
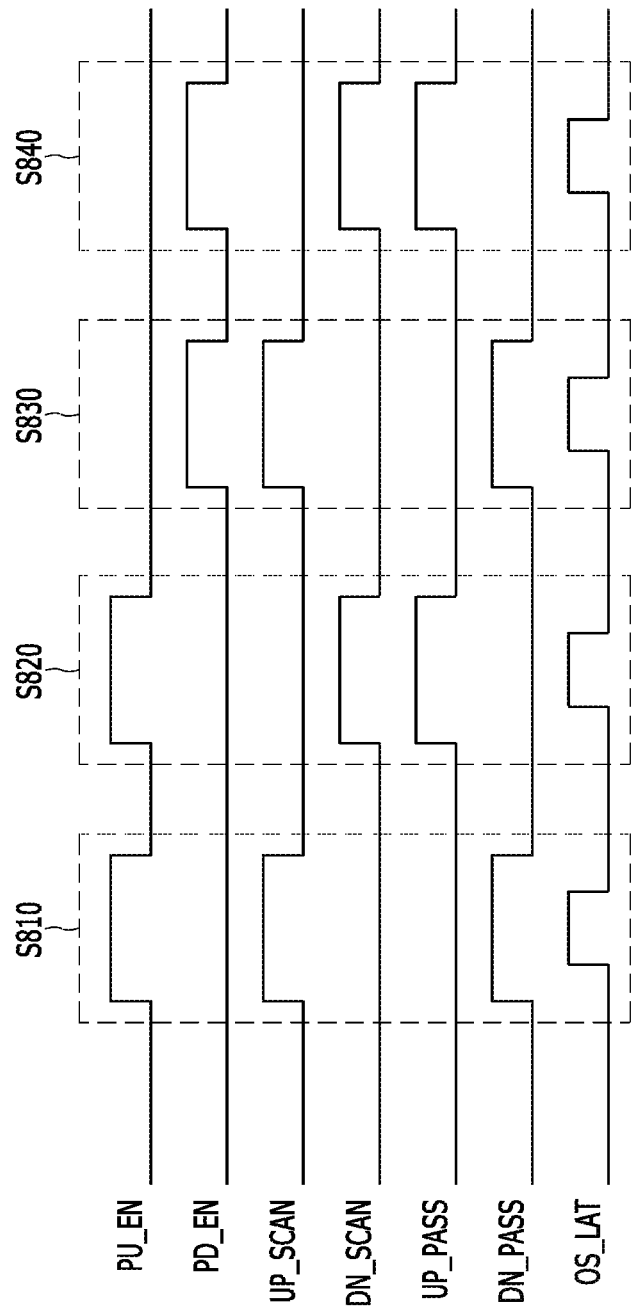

FIGS. 7 and 8 are a flow chart and a timing diagram for describing a test operation of a semiconductor device in accordance with various embodiments of the present invention.

Referring to FIGS. 7 and 8, a high test for the up-latch circuit 224 may be performed (step S810). For the high test, the first to n-th through-electrode driving circuits 210_1 to 210_n may charge the first to n-th through-electrodes TSV1 to TSVn to a first voltage level. As the pull-up driving signal PU_EN is activated, the first to n-th through-electrode driving circuits 210_1 to 210_n may pull up the first to n-th through-electrodes TSV1 to TSVn to a supply voltage VDD. Each of the first to n-th error detection circuits 220_1 to 220_n may store the voltage level of the corresponding through-electrode as the up-detection signal UP_DET while masking the down-detection signal DN_DET, thereby outputting the corresponding error detection signal.

In an embodiment, as the up-scan signal UP_SCAN and the latch signal OS_LAT are activated, the up-latch circuit 224 may store the voltage level of the corresponding through-electrode as the up-detection signal UP_DET. At this time, since the down masking signal DN_PASS is activated, the masking circuit 228 may mask the down-detection signal DN_DET. The decision circuit 226 may generate the corresponding error detection signal based on the down-detection signal DN_DET, which is masked to a logic high level, and the up-detection signal UP_DET. As a result, during the high test for the up-latch circuit 224, the first to n-th error detection signals FAIL<1:n> may be generated according to the up-detection signal UP_DET outputted from the up-latch circuit 224, regardless of an operation of the down-latch circuit 222.

Though not shown in FIG. 8, as the selection signal SEL transits to a logic high level and the shifting clock SCLK toggles one time, the first to n-th shifting circuits 230_1 to 230_n may store the first to n-th error detection signals FAIL<1:n>, respectively. Further, as the selection signal SEL transitions to a logic low level and the shifting clock SCLK toggles n times, the first to n-th shifting circuits 230_1 to 230_n may sequentially shift the first to n-th error detection signals FAIL<1:n> to output the n-th shifting signal SRO<n> to the outside through the test pad TPAD.

The external test device may monitor/detect whether the up-latch circuit 224 operates normally, based on the n-th shifting signal SRO<n>. For example, in the case where the first to n-th error detection signals FAIL<1:n> are sequentially outputted to a logic high level, the external test device may determine that all of the up-latch circuits 224 of the first to n-th error detection circuits 220_1 to 220_n operate normally. On the contrary, in a case where any of the first to n-th error detection signals FAIL<1:n> is outputted to a logic low level, the external test device may determine that the up-latch circuit 224 corresponding to the error detection signal having the logic low level operates abnormally. That is, the up-latch circuit 224 corresponding to the error detection signal having the logic low level may have defects.

Next, a high test for the down-latch circuit 222 may be performed (step S820). For the high test, the pull-up driving signal PU_EN may be activated, and thus the first to n-th through-electrode driving circuits 210_1 to 210_n may pull up the first to n-th through-electrodes TSV1 to TSVn to the supply voltage VDD. Each of the first to n-th error detection circuits 220_1 to 220_n may store the voltage level of the corresponding through-electrode as the down-detection signal DN_DET while masking the up-detection signal UP_DET, thereby outputting the corresponding error detection signal.

In an embodiment, as the down-scan signal DN_SCAN and the latch signal OS_LAT are activated, the down-latch circuit 222 may store the voltage level of the corresponding through-electrode as the down-detection signal DN_DET. At this time, since the up-masking signal UP_PASS is activated, the masking circuit 228 may mask the up-detection signal UP_DET. The decision circuit 226 may generate the corresponding error detection signal based on the down-detection signal DN_DET and the up-detection signal UP_DET which is masked to a logic high level. As a result during the high test for the down-latch circuit 222, the first to n-th error detection signals FAIL<1:n> may be generated according to the down-detection signal DN_DET outputted from the down-latch circuit 222, regardless of an operation of the up-latch circuit 224.

Thereafter, according to the selection signal SEL and the shifting clock SCLK, the first to n-th shifting circuits 230_1 to 230_n may respectively store and sequentially shift the first to n-th error detection signals FAIL<1:n> to output the n-th shifting signal SRO<n> to the outside through the test pad TPAD. The external test device may monitor/detect whether the down-latch circuit 222 operates normally, based on the n-th shifting signal SRO<n>.

Next, a low test for the up-latch circuit 224 may be performed (step S830). For the low test, the pull-down driving signal PD_EN may be activated and then the first to n-th through-electrode driving circuits 210_1 to 210_n may pull down the first to n-th through-electrodes TSV1 to TSVn to a ground voltage VSS. As the up-scan signal UP_SCAN, the latch signal OS_LAT and the down masking signal DN_PASS are activated, each of the first to n-th error detection circuits 220_1 to 220_n may store the voltage level of the corresponding through-electrode as the up-detection signal UP_DET while masking the down-detection signal DN_DET, thereby outputting the corresponding error detection signal. Thereafter, according to the selection signal SEL and the shifting clock SCLK, the first to n-th shifting circuits 230_1 to 230_n may respectively store and sequentially shift the first to n-th error detection signals FAIL<1:n> to output the n-th shifting signal SRO<n> to the outside through the test pad TPAD.

The external test device may monitor/detect whether the up-latch circuit 224 operates normally, based on the n-th shifting signal SRO<n>. For example, in a case where the first to n-th error detection signals FAIL<1:n> are sequentially outputted to a logic low level, the external test device may determine that all of the up-latch circuits 224 of the first to n-th error detection circuits 220_1 to 220_n operate normally. On the contrary, in a case where any of the first to n-th error detection signals FAIL<1:n> is outputted to a logic high level, the external test device may determine that the up-latch circuit 224 corresponding to the error detection signal having the logic low level operates abnormally.

Next, a low test for the down-latch circuit 222 may be performed (step S840). For the low test, the pull-down driving signal PD_EN may be activated, and thus the first to n-th through-electrode driving circuits 210_1 to 210_n may pull down the first to n-th through-electrodes TSV1 to TSVn to the ground voltage VSS. As the down-scan signal DN_SCAN, the latch signal OS_LAT and the up-masking signal UP_PASS are activated, each of the first to n-th error detection circuits 220_1 to 220_n may store the voltage level of the corresponding through-electrode as the down-detection signal DN_DET while masking the up-detection signal UP_DET, thereby outputting the corresponding error detection signal. Thereafter, according to the selection signal SEL and the shifting clock SCLK, the first to n-th shifting circuits 230_1 to 230_n may respectively store and sequentially shift the first to n-th error detection signals FAIL<1:n> to output the n-th shifting signal SRO<n> to the outside through the test pad TPAD.

FIGS. 7 and 8 shows a case where the high test S810 for the up-latch circuit 224, the high test S820 for the down-latch circuit 222, the low test S830 for the up-latch circuit 224 and the low test S840 for the down-latch circuit 222 may be sequentially performed. However, the concept and spirit of the present invention are not limited thereto and a sequence of the tests S810 to S840 may be changed without departing from the scope of the invention. For example, in an embodiment, the high test S810 for the up-latch circuit 224, the low test S830 for the up-latch circuit 224, the high test S820 for the down-latch circuit 222, and the low test S840 for the down-latch circuit 222 may be sequentially performed in the recited order.

Figure 9:
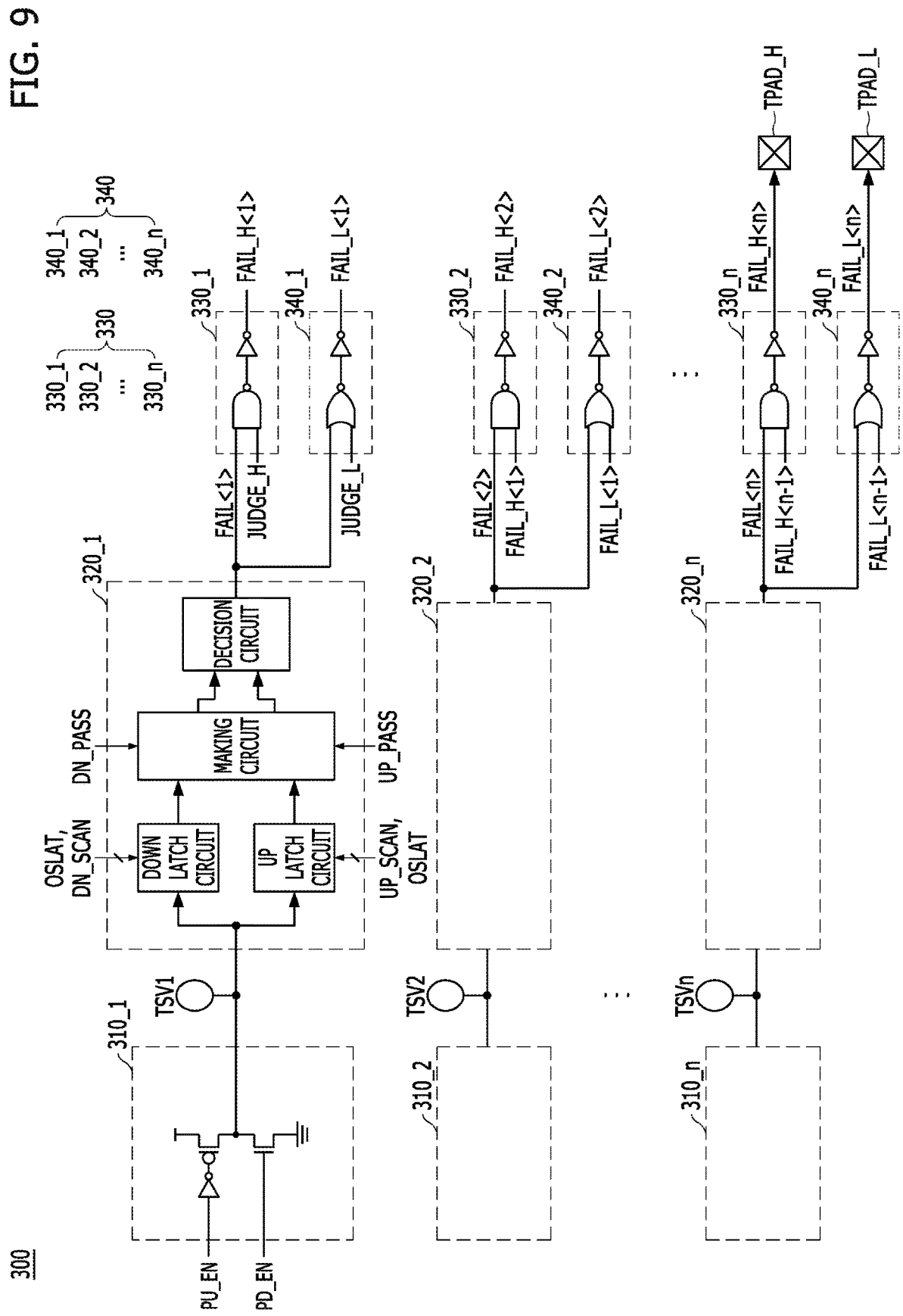
FIG. 9 is a circuit diagram illustrating a semiconductor device in accordance with various embodiments of the present invention.

FIG. 9 is a circuit diagram illustrating a semiconductor device 300 in accordance with various embodiments of the present invention.

Referring to FIG. 9, the semiconductor device 300 may include first to n-th through-electrodes TSV1 to TSVn, first to n-th through-electrode driving circuits 310_1 to 310_n, and first to n-th error detection circuits 320_1 to 320_n. The first to n-th through-electrode driving circuits 310_1 to 310_n and the first to n-th error detection circuits 320_1 to 320_n may have substantially the same configurations of FIG. 5.

Different from the semiconductor device 200 in FIG. 5, the semiconductor device 300 may compress first to n-th error detection signals FAIL<1:n> outputted from the first to n-th error detection circuits 320_1 to 320_n, thereby outputting first and second compression signals FAIL_H<n> and FAIL_L<n> at a time.

The semiconductor device 300 may include a first compression circuit 330 and a second compression circuit 340.

The first compression circuit 330 may compress the first to n-th error detection signals FAIL<1:n> to output the first compression signal FAIL_H<n>, when the first to n-th through-electrodes TSV1 to TSVn are charged to the first voltage level during a high test. The first compression circuit 330 may output the first compression signal FAIL_H<n> by performing a logic AND operation on the first to n-th error detection signals FAIL<1:n> according to a first judgement signal JUDGE_H. The first judgement signal JUDGE_H may be activated to a logic high level during the high test.

The first compression signal FAIL_H<n> may be outputted to an external device (or to the outside) through a first test pad TPAD_H.

In an embodiment, the first compression circuit 330 may include first to n-th high compressors 330_1 to 330_n. The first to n-th high compressors 330_1 to 330_n may perform a logic AND operation on the first to n-th error detection signals FAIL<1:n> and signals FAIL_H<1:n−1> outputted from previous-positioned high compressors 330_1 to 330_n−1. The first high compressor 330_1 positioned at a first stage may perform a logic AND operation on the first error detection signal FAIL<1> and the first judgement signal JUDGE_A. The n-th high compressor 330_n positioned at a last stage may output the first compression signal FAIL_H<n> by performing a logic AND operation on the n-th error detection signal FAIL<n> and the signal FAIL_H<n−1> outputted from the (n−1)-th high compressor 330_n−1. FIG. 9 shows that each of the first to n-th high compressors 330_1 to 330_n is implemented with a NAND gate and an inverter. However, the concept and spirit of the present invention are not limited thereto and the first to n-th high compressors 330_1 to 330_n may be implemented with various logic circuits for performing a logic AND operation.

The second compression circuit 340 may compress the first to n-th error detection signals FAIL<1:n> to output the second compression signal FAIL_L<n>, when the first to n-th through-electrodes TSV1 to TSVn are discharged to the second voltage level during a low test. The second compression circuit 340 may output the second compression signal FAIL_L<n> by performing a logic OR operation on the first to n-th error detection signals FAIL<1:n> according to a second judgement signal JUDGE_L. The second judgement signal JUDGE_L may be activated to a logic low level during the low test. The second compression signal FAIL_L<n> may be outputted to the outside through a second test pad TPAD_L.

In an embodiment, the second compression circuit 340 may include first to n-th low compressors 340_1 to 340_n. The first to n-th low compressors 340_1 to 340_n may perform a logic OR operation on the first to n-th error detection signals FAIL<1:n> and signals FAIL_L<1:n−1> outputted from previous-positioned low compressors 340_1 to 340_n−1. The first low compressor 340_1 positioned at a first stage may perform a logic OR operation on the first error detection signal FAIL<1> and the second judgement signal JUDGE_L. The n-th low compressor 340_n positioned at a last stage may output the second compression signal FAIL_L<n> by performing a logic OR operation on the n-th error detection signal FAIL<n> and the signal FAIL_L<n−1> outputted from the (n−1)-th low compressor 340_n−1. FIG. 9 shows that each of the first to n-th low compressors 340_1 to 340_n is implemented with a NOR gate and an inverter. However the concept and spirit of the present invention are not limited thereto and the first to n-th low compressors 340_1 to 340_n may be implemented with various logic circuits for performing a logic OR operation.

Hereinafter, referring to FIGS. 7 to 9, a test operation of the semiconductor device 300 in accordance with the present embodiment will be described.

First, a high test for an up-latch circuit may be performed (step S810). During the high test, the pull-up driving signal PU_EN may be activated, and the up-scan signal UP_SCAN, the latch signal OS_LAT, and the down masking signal DN_PASS may be activated. Accordingly, the first to n-th error detection signals FAIL<1:n> may be generated according to the up-detection signal UP_DET outputted from the up-latch circuit, regardless of an operation of a down-latch circuit. The first compression circuit 330 may perform a logic AND operation on the first to n-th error detection signals FAIL<1:n> to output the first compression signal FAIL_H<n>, when the first judgement signal JUDGE_H transits to a logic high level. An external test device may monitor/detect whether the up-latch circuit operates normally, based on the first compression signal FAIL_H<n> outputted through the first test pad TPAD_H. For example, in a case where the first compression signal FAIL_H<n> is outputted to a logic high level during the high test, the external test device may determine that all of the up-latch circuits of the first to n-th error detection circuits 320_1 to 320_n operate normally. On the contrary, in a case where the first compression signal FAIL_H<n> is outputted to a logic low level during the high test, the external test device may determine that at least one of the up-latch circuits operates abnormally.

Next, a high test for the down-latch circuit may be performed (step S820). Likewise, the first to n-th error detection signals FAIL<1:n> may be generated according to the down-detection signal DN_DET outputted from the down-latch circuit, regardless of an operation of the up-latch circuit. The first compression circuit 330 may perform a logic AND operation on the first to n-th error detection signals FAIL<1:n> to output the first compression signal FAIL_H<n>, when the first judgement signal JUDGE_H transitions to a logic high level. The external test device may monitor/detect whether the down-latch circuit operates normally, based on the first compression signal FAIL_H<n> outputted through the first test pad TPAD_H.

Next, a low test for the up-latch circuit may be performed (step S830). During the low test, the pull-down driving signal PD_EN may be activated, and the up-scan signal UP_SCAN, the latch signal OS_LAT, and the down masking signal DN_PASS may be activated. Accordingly, the first to n-th error detection signals FAIL<1:n> may be generated according to the up-detection signal UP_DET outputted from the up-latch circuit, regardless of an operation of a down-latch circuit. The second compression circuit 340 may perform a logic OR operation on the first to n-th error detection signals FAIL<1:n> to output the second compression signal FAIL_L<n>, when the second judgement signal JUDGE_L transitions to a logic low level. The external test device may monitor/detect whether the up-latch circuit operates normally, based on the second compression signal FAIL_L<n> outputted through the second test pad TPAD_L. For example, in a case where the second compression signal FAIL_L<n> is outputted to a logic low level during the low test, the external test device may determine that all of the up-latch circuits of the first to n-th error detection circuits 320_1 to 320_n operate normally. On the contrary, in a case where the second compression signal FAIL_L<n> is outputted to a logic high level during the low test, the external test device may determine that at least one of the up-latch circuits operates abnormally.

Next, a low test for the down-latch circuit may be performed (step S840). Likewise, the first to n-th error detection signals FAIL<1:n> may be generated according to the down-detection signal DN_DET outputted from the down-latch circuit, regardless of an operation of the up-latch circuit. The second compression circuit 340 may perform a logic OR operation on the first to n-th error detection signals FAIL<1:n> to output the second compression signal FAIL_L<n>, when the second judgement signal JUDGE_L transitions to a logic low level. The external test device may monitor/detect whether the down-latch circuit operates normally, based on the second compression signal FAIL_L<n> outputted through the second test pad TPAD_L.

According to an embodiment, a sequence of the tests S810 to S840 may be adjusted depending on the design option. The semiconductor device 200 of FIG. 5 may even identify the location of the error detection circuit in which a defect occurs. That is, the semiconductor device 200 may identify which of the plurality of error detection circuits has the defect. Although the semiconductor device 300 of FIG. 9 may not identify the location of the error detection circuit in which a defect occurs, the semiconductor device 300 may determine whether any of the error detection circuits has a defect, within a short period of time.

In accordance with the present embodiment, the semiconductor device can improve the overall chip manufacturing yield by detecting whether the error detection circuits for the through-electrodes operate normally. Further, the semiconductor device can reduce/minimize the unnecessary cost and time spent packaging/stacking the chips/dies by detecting the normal operation of the error detection circuit for the through-electrodes before stacking the chips/dies.

Figure 10:
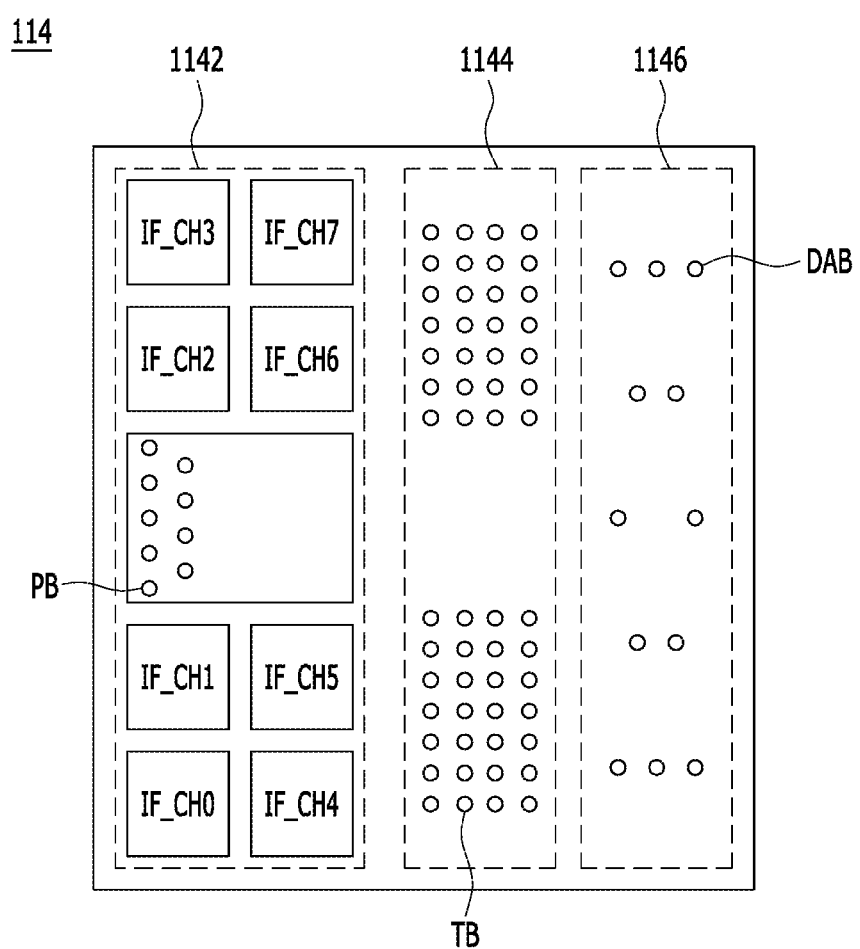
FIG. 10 is a plan view describing bumps disposed on a base logic die shown in FIG. 2 in accordance with an embodiment of the present invention.

FIG. 10 is a plan view describing bumps disposed on the base die 114 shown in FIG. 2.

Referring to FIG. 10, the physical area 1142, the TSV area 1144, and the direct access area 1146 may be disposed in the base die 114. In the physical area 1142, channel interface areas IF_CH0 to IF_CH7 for interfacing with the first to eighth channels CH0 to CH7 of the first to fourth core dies 112_0 to 112_3 may be disposed.

A plurality of PHY bumps PB for interfacing with the controller 120 may be formed on the physical area 1142. A plurality of TSV bumps TB for interfacing with the through-electrodes TSVs may be formed on the TSV area 1144. A plurality of DA bumps DAB for interfacing with an external test device through the interposer 130 to test the stacked memory device 110, may be formed on the direct access area 1146. The PHY bumps PB, the TSV bumps TB and the DA bumps DB may be formed of micro-bumps. Though it is not shown, a plurality of DA pads DAP coupled to the DA bumps DB may be additionally formed on the direct access area 1146. The DA pads DAP may be relatively larger in physical size and have fewer number than the PHY bumps PB and the DA bumps DB.

As mentioned above, since the physical size of the PHY bumps PB is very small and the number of the PHY bumps PB is very large with more than 1000, it is difficult to test the stacked memory device 110 using the PHY bumps PB in reality. Furthermore, since the stacked memory device 110 communicates with the controller 120 in the form of a system-in-package (SIP), it is more difficult to test the stacked memory device 110 using the PHY bumps PB. For those reasons, the stacked memory device 110 may be tested using the DA bumps DB or the DA pads DAP, which are relatively larger in physical size and smaller in number than the PHY bumps PB.

Figure 11:
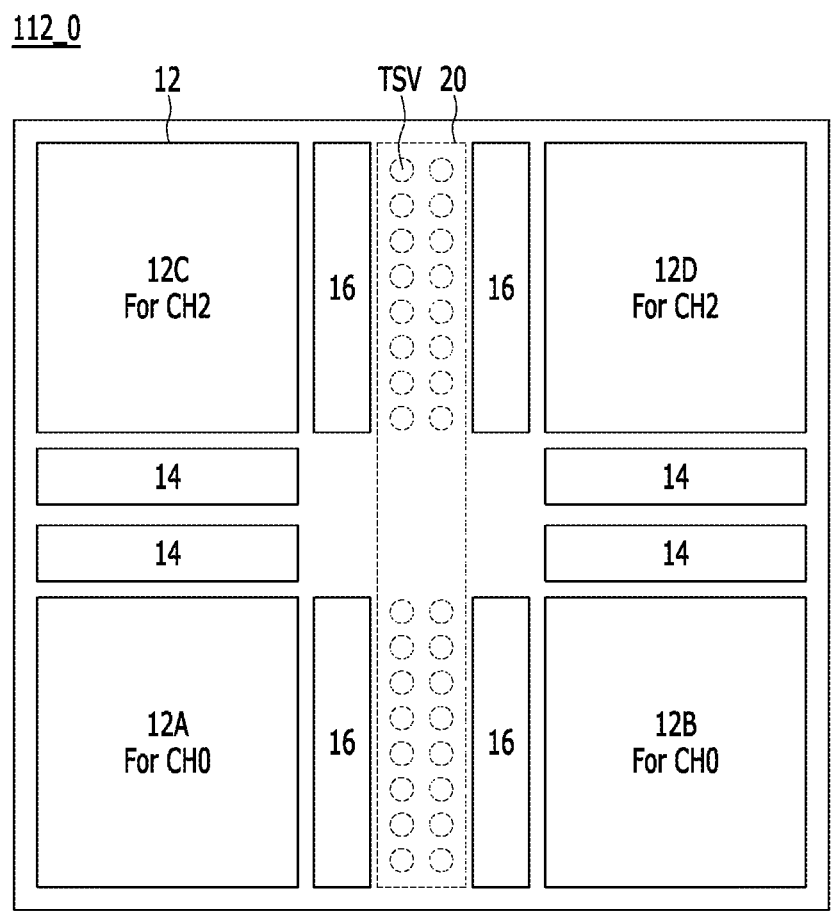
FIG. 11 is a plan view describing bumps disposed on a core die shown in FIG. 2 in accordance with an embodiment of the present invention.

FIG. 11 is a plan view describing bumps disposed on the first core die 112_0 shown in FIG. 2. For reference, the second to fourth core die 112_1 to 112_3 may have substantially the same configuration as the first core die 112_0.

Referring to FIG. 11, the first core die 112_0 may include a core region and a peripheral region in accordance with an embodiment of the present invention.

In the core region, a plurality of cell array areas 12, for example, four cell array areas 12 may be disposed. The four cell array areas 12 may be disposed at the four corners of the first core die 112_0, to thereby form a cross-shaped area between them. A plurality of memory cells may be placed in each of the cell array areas 12. For example, as illustrated in FIG. 11, lower cell array areas 12A and 12B among the cell array areas 12 may be allocated to the first channel CH0, while upper cell array areas 12C and 12D may be allocated to the third channel CH2. Further, in the core region, a plurality of column decoder areas 14 and a plurality of row decoder areas 16 may be disposed. For example, as illustrated in FIG. 11, a plurality of column decoder areas 14 (e.g., two column decoder areas) may be disposed between the memory cell areas 12A and 12C. Also, a plurality of column decoder areas 14 (e.g., two column decoder areas) may be disposed between the memory cell areas 12B and 12D. A plurality of row decoder areas 16 (e.g., two row decoder areas) may be disposed between the memory cell areas 12D and 12C. Also, a plurality of row decoder areas 16 (e.g., two row decoder areas) may be disposed between the memory cell areas 12B and 12A. A plurality of column decoders (not shown) related to a command/address control may be placed in the column decoder areas 14. The column decoders may select column lines (i.e., bit lines) of their respective cell array areas 12 by receiving and decoding a column address. Further, a plurality of write drivers (not shown) and a plurality of input/output (I/O) sense amplifiers (not shown) may be placed in the column decoder areas 14. A plurality of row decoders (not shown) related to a command/address control may be placed in the row decoder areas 16. The row decoders may select row lines (i.e., word lines) of the cell array areas 12 by receiving and decoding a row address. The peripheral region including the through-electrodes TSV may be disposed between each pair of the row decoder areas 16. More specifically, the peripheral region may include a first region between the pair of row decoder areas 16 positioned between the memory cell areas 12C and 12D. The peripheral region may include a second region between the pair of row decoder areas 16 positioned between the memory cell areas 12A and 12B.

In the peripheral region, a peripheral circuit (not shown) for controlling components disposed in the core region, an interface circuit (not shown) for interfacing with the through-electrodes TSV, and the through-electrodes TSV may be disposed. In particular, an area in which the interface circuit and the through-electrodes TSV are disposed may be defined as a TSV area 20. The first core die 112_0 may receive input signals from the outside (e.g., the base die 114) through the through-electrodes TSV, or transmit output signals to the outside through the through-electrodes TSV. Depending on an embodiment, the TSV area 20 may be located in the center of the first core die 112_0 from a planar perspective. However, the concept and spirit of the present invention are not limited thereto and the planar layout of the TSV area 20 may vary widely depending on the design option.

Figure 12:
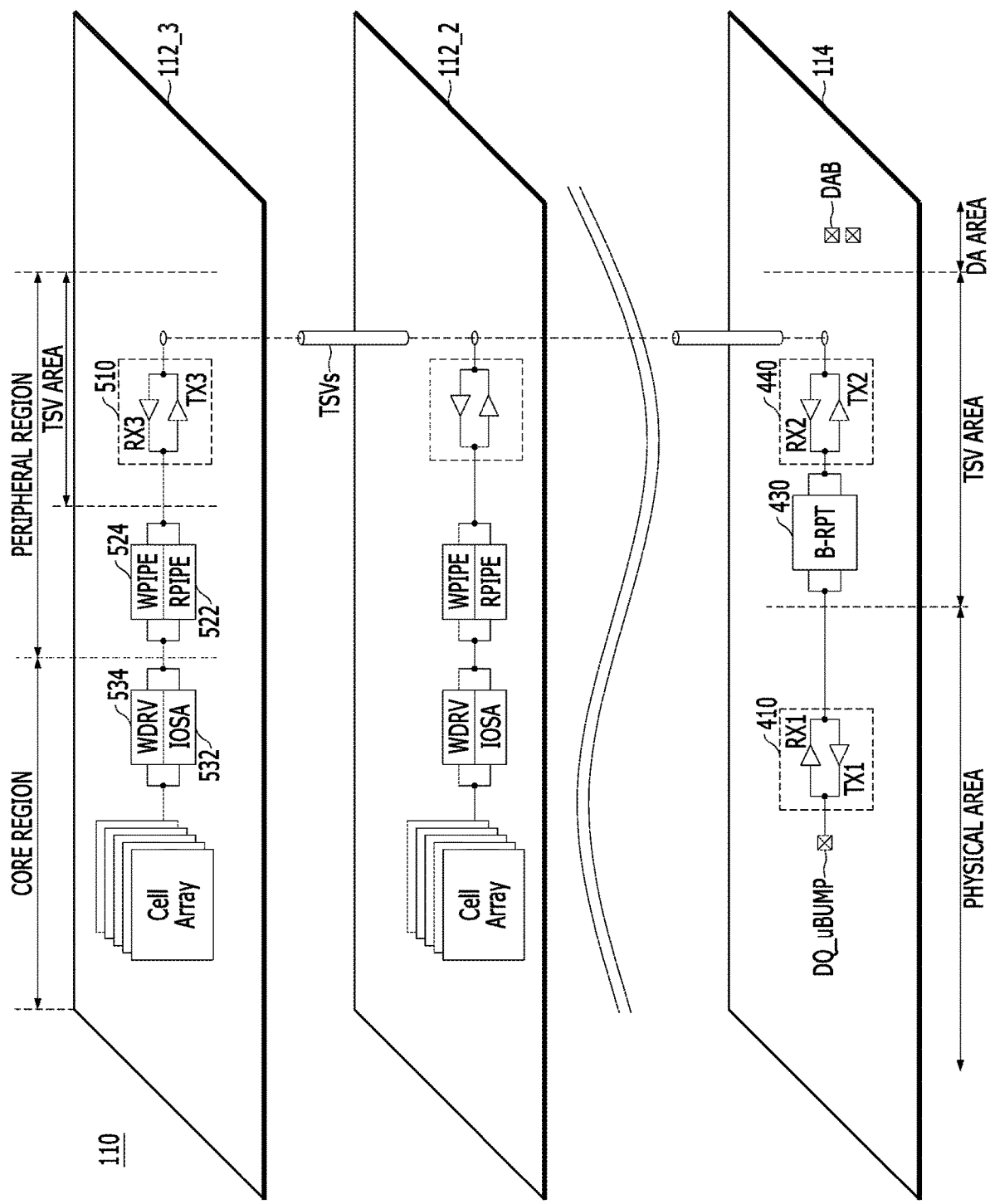
FIG. 12 is a diagram illustrating a configuration of a stacked memory device in accordance with an embodiment of the present invention.

FIG. 12 is a diagram illustrating a configuration of the stacked memory device 100 in accordance with an embodiment of the present invention. For the convenience of explanation, FIG. 12 shows one through-electrode TSV for each die, but in practice a number of through-electrodes TSVs may be deployed. In FIG. 12, the composition related to a data input/output operation between the base die 114 and the first to fourth core dies 112_0 to 112_3 is mainly illustrated.

Referring to FIG. 12, the stacked memory device 110 may include the base die 114 and the first to fourth core dies 112_0 to 112_3. The first to fourth core dies 112_and the base die 114 may be vertically coupled to a substrate through the through-electrodes TSVs to transmit signals therebetween.

The base die 114 may include a physical area, a TSV area and a direct access (DA) area. In the physical area, a data pad DQ_uBUMP and a first input/output (I/O) buffer circuit 410 may be disposed. In the TSV area, a bi-directional repeater (B-RPT) 430, a second I/O buffer circuit 440, and the through-electrodes TSVs for penetrating the first to fourth core dies 112_and the base die 114, may be disposed. In the DA area, a plurality of DA bumps DAB may be disposed. Though one data pad DQ_uBUMP and circuits corresponding thereto are shown in FIG. 12, a number of data pads and circuits corresponding thereto may be deployed in practice.

The data pad DQ_uBUMP may be composed of a microbump for interfacing with the controller (120 of FIG. 1), and correspond to the PHY bump (PB of FIG. 10). The first I/O buffer circuit 410 may receive and output data (or signals) transferred from/to the controller 120. The first I/O buffer circuit 410 may include an input buffer (or receiver) RX1 and an output buffer (or output driver or transmitter) TX1. The input buffer RX1 may buffer a write data inputted from the controller 120 through the data pad DQ_uBUMP to provide the buffered write data to the bi-directional repeater 430, during a write operation. The output buffer TX1 may buffer a read data transferred from the bi-directional repeater 430 to output the buffered read data to the controller 120 through the data pad DQ_uBUMP, during a read operation.

The bi-directional repeater 430 may reproduce and amplify the write data provided from the input buffer RX1 during the write operation. The bi-directional repeater 430 may reproduce and amplify the read data transferred from the second I/O buffer circuit 440 during the read operation. The second I/O buffer circuit 440 may receive and output data (or signals) transferred from/to the through-electrodes TSVs. The second I/O buffer circuit 440 may include an input buffer (or receiver) RX2 and an output buffer (or output driver or transmitter) TX2. The output buffer TX2 may buffer the write data transferred from the bi-directional repeater 430 to output the buffered write data to the through-electrodes TSVs, during the write operation. The input buffer RX2 may buffer the read data transferred from the through-electrodes TSVs to provide the buffered read data to the bi-directional repeater 430, during the read operation. The second I/O buffer circuit 440 may serve as an interface circuit for the through-electrodes TSVs.

Since the first to fourth core dies 112_0 to 112_3 have substantially the same configuration, the fourth core die 112_3 will be explained as an example. The fourth core die 112_3 may include a core region and a peripheral region. In the core region, any of the cell array areas (12 of FIG. 11) may be disposed. Further, an I/O sense amplifier (IOSA) 532 and a write driver (WDRV) 534 may be placed in the core region. In the peripheral region, a third I/O buffer circuit 510, a read pipe latch (RPIPE) 522, a write pipe latch (WPIPE) 524, and the through-electrodes TSVs for penetrating the first to fourth core dies 112_and the base die 114, may be disposed. In the peripheral region, an area in which the through-electrodes TSVs and the third I/O buffer circuit 510 for interfacing with the through-electrodes TSVs are located, may be defined as a TSV area.

The third I/O buffer circuit 510 may receive and output data (or signals) transferred from/to the through-electrodes TSVs. The third I/O buffer circuit 510 may include an input buffer (or receiver) RX3 and an output buffer (or output driver or transmitter) TX3. The input buffer RX3 may buffer the write data transferred from the through-electrodes TSVs to provide the buffered write data to the write pipe latch 524 during the write operation. The output buffer TX3 may buffer the read data transferred from the read pipe latch 522 to output the buffered read data to the through-electrodes TSVs, during the read operation. The third I/O buffer circuit 510 may serve as an interface circuit for the through-electrodes TSVs. The write pipe latch 524 may align the write data provided from the input buffer RX3 to provide the aligned write data to the write driver 534, during a write operation. The read pipe latch 522 may align the read data outputted from the I/O sense amplifier 532 to output the aligned read data to the output buffer TX3, during a read operation. The write driver 534 may write the write data into the cell array area during a write operation. The I/O sense amplifier 532 may sense and amplify the read data outputted from the cell array area during a read operation.

The through-electrodes TSVs that are abnormally formed due to various factors in the manufacturing process may have a resistance or capacitance value greater than that of a target value corresponding to the normally formed through-electrode TSV. At this time, the abnormally formed through-electrodes TSVs may not be suitable for signal transmission even if they pass an open/short test to guarantee physical connections of the through-electrodes TSVs. In order to test the signal transmission status of the through-electrodes TSVs, a process is required to write test data in the cell array area of the core region, read out the test data, and verify whether the read-out test data is identical to a target data. In other words, additional components, such as the cell array area, the I/O sense amplifier, and the write driver in the core region, and the pipe latches in the peripheral region, have to be operated in order to test the signal transmission status of the through-electrodes TSVs. As a result, it is difficult to identify the inherent characteristics and operational currents of only the through-electrodes TSVs.

Hereafter, a method of testing a signal transmission status of through-electrodes TSVs at a wafer level by using the through-electrodes TSVs and an interface circuit for the through-electrodes TSVs, except for the additional components disposed in the core region, will be explained.

Figure 13:
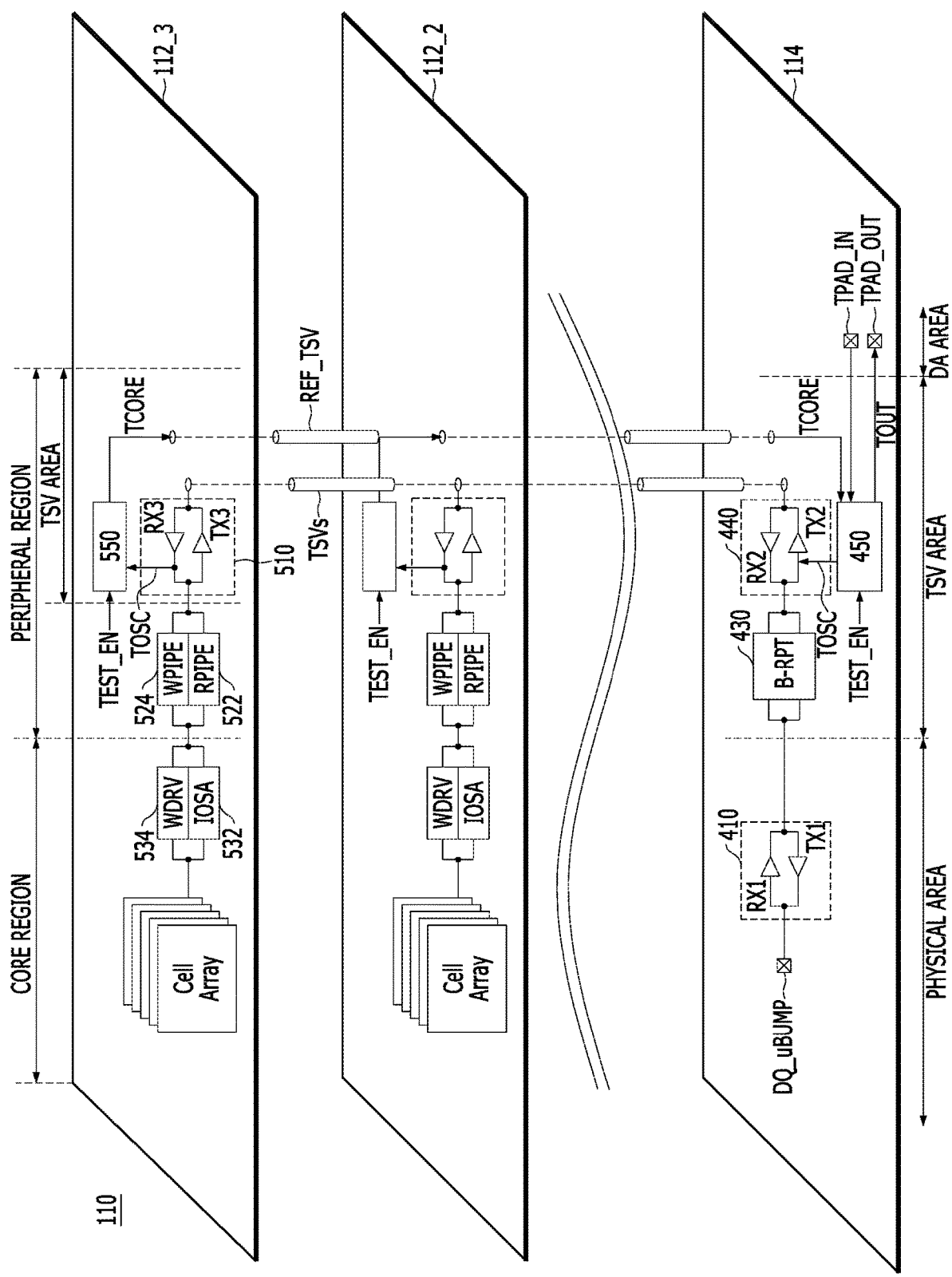
FIG. 13 is a diagram illustrating a configuration of a stacked memory device in accordance with an embodiment of the present invention.

FIG. 13 is a diagram illustrating a configuration of the stacked memory device 110 in accordance with an embodiment of the present invention. In FIGS. 12 and 13, the same composition has been given the same reference numeral and the relevant details are omitted.

Referring to FIG. 13, the stacked memory device 110 may include the base die 114 and the first to fourth core dies 112_0 to 112_3. The first to fourth core dies 112_and the base die 114 may be vertically coupled to a substrate through through-electrodes TSVs and a reference through-electrode REF_TSV to transmit signals therebetween.

The base die 114 may include a first test circuit 450. The first test circuit 450 may transfer a test oscillating signal TOSC to at least one (hereinafter referred to as a "target through-electrode TSV") of the through-electrodes TSVs, according to a test signal TEST_EN that is activated during a test operation. The target through-electrode TSV may include through-electrodes connected in the column direction, among the through-electrodes TSVs. The first test circuit 450 may provide the test oscillating signal TOSC to the output buffer TX2 of the second I/O buffer circuit 440, during the test operation. The first test circuit 450 may output a test output signal TOUT by comparing a base signal (TBASE, not shown) which is generated based on the test oscillating signal TOSC, with a test core signal TCORE which is transferred through the reference through-electrode REF_TSV. The base die 114 may include a physical area, a TSV area and a direct access (DA) area. In an embodiment, the first test circuit 450 may be disposed in the TSV area of the base die 114. A data pad DQ_uBUMP, a first I/O buffer circuit 410, a bi-directional repeater 430, and a second I/O buffer circuit 440 of FIG. 13 may be substantially the same configurations of FIG. 12.

Meanwhile, a test output pad TPAD_OUT for outputting the test output signal TOUT to an external device (e.g., a test device), may be disposed in the base die 114. Further, a test input pad TPAD_IN for receiving the test oscillating signal TOSC from the external device, may be disposed in the base die 114. The test output pad TPAD_OUT and the test input pad TPAD_IN may be composed of DA bumps DAB formed on the DA area.

Each of the first to fourth core dies 112_0 to 112_3 may include a second test circuit 550. The second test circuit 550 may generate the test core signal TCORE corresponding to the test oscillating signal TOSC transferred through the target through-electrode TSV, according to the test signal TEST_EN, and transfer the test core signal TCORE to the reference through-electrode REF_TSV. The second test circuit 550 may receive the test oscillating signal TOSC provided from the input buffer RX3 of the third I/O buffer circuit 510, during the test operation each of the first to fourth core dies 112_0 to 112_3 may include a core region and a peripheral region. In an embodiment, the second test circuit 550 may be disposed in the peripheral region of each of the first to fourth core dies 112_0 to 112_3. In an embodiment, the second test circuit 550 may be disposed in the TSV area of the peripheral region. A third I/O buffer circuit 510, a read pipe latch 522, a write pipe latch 524, an I/O sense amplifier 532, a write driver 534, and a cell array area of FIG. 13 may be substantially the same configurations of FIG. 12.

During a boot-up operation or an initial operation, a chip identification (ID) signal may be allocated to each of the first to fourth core dies 112_0 to 112_3. For example, a chip ID signal of '00' may be allocated to the first core die 112_0, a chip ID signal of '01' may be allocated to the second core die 112_1, a chip ID signal of '10' may be allocated to the third core die 112_2, and a chip ID signal of '11' may be allocated to the fourth core die 112_3. According to an embodiment, using such a chip ID signal having stack information, the test signal TEST_EN may be applied to a corresponding one of the first to fourth core dies 112_0 to 112_3 so as to operate the second test circuit 550.

Hereinafter, a detailed configuration of the first test circuit 450 and the second test circuit 550 will be explained.

Figure 14:
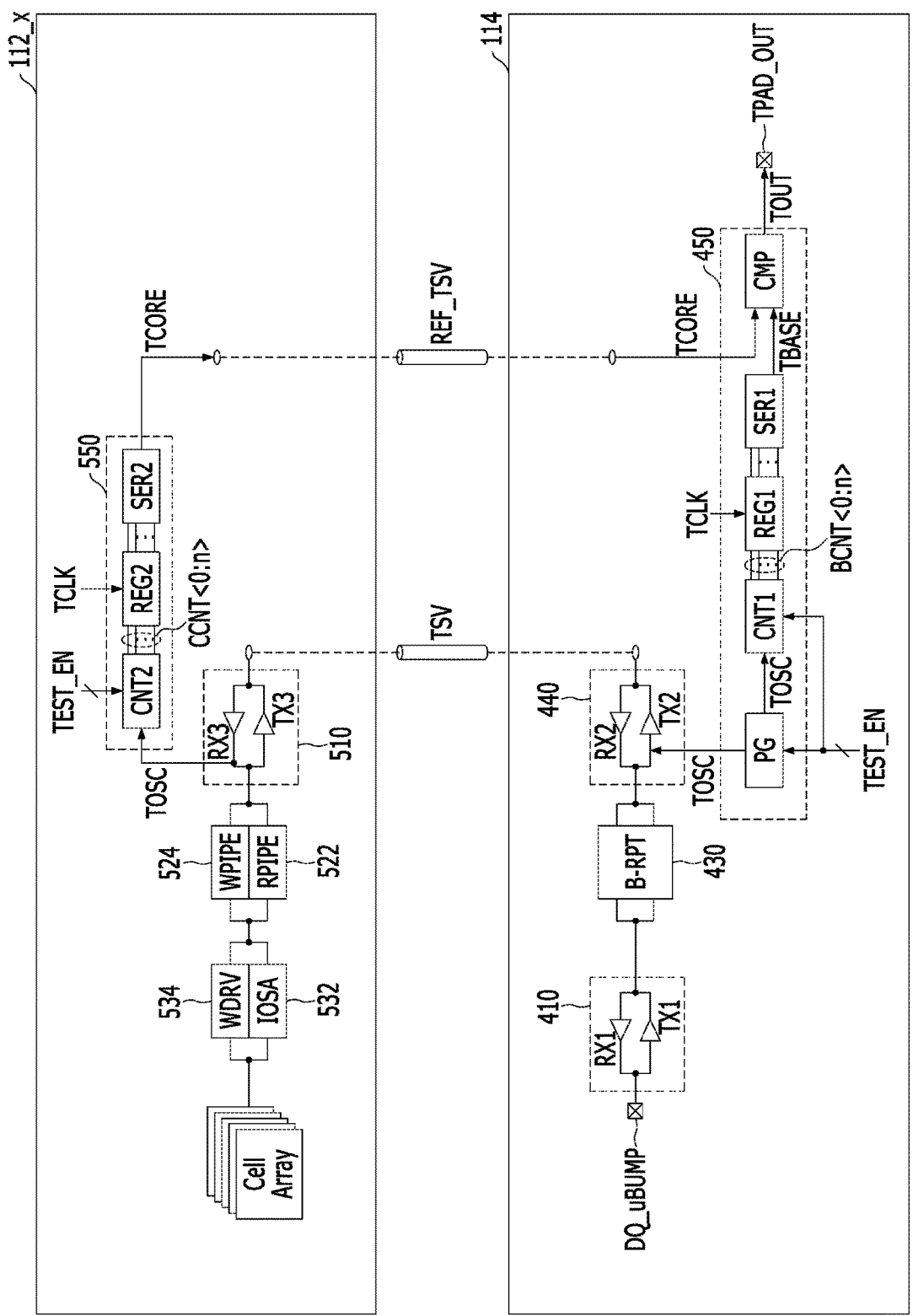
FIG. 14 is a detailed diagram illustrating first and second test circuits of the stacked memory device of FIG. 13, in accordance with a first embodiment of the present invention.

FIG. 14 is a detailed diagram illustrating the first test circuit 450 and the second test circuit 550 of the stacked memory device 110 of FIG. 13, in accordance with a first embodiment of the present invention. In FIG. 14, it is assumed that the second test circuit 550 of the core die 112_x among the first to fourth core dies 112_0 to 112_3 is activated.

Referring to FIG. 14, the data pad DQ_uBUMP and the first I/O buffer circuit 410 may be disposed in the physical area of the base die 114, and the target through-electrode TSV, the reference through-electrode REF_TSV, and the second I/O buffer circuit 440 may be disposed in the TSV area of the base die 114. The first test circuit 450 may be disposed in the TSV area of the base die 114. The bi-directional repeater 430 may be disposed in the TSV area between the first I/O buffer circuit 410 and the second I/O buffer circuit 440.

The first test circuit 450 may include a pattern generator PG, a first counter CNT1, a first serializer SER1, and a comparator CMP.

The pattern generator PG may generate the test oscillating signal TOSC, and provide the test oscillating signal TOSC to the output buffer TX2 of the second I/O buffer circuit 440, according to the test signal TEST_EN. The output buffer TX2 may transfer the test oscillating signal TOSC to the core die 112_x through the target through-electrode TSV. The test signal TEST_EN may be activated during the test operation. The test signal TEST_EN may be a multi-bit signal having frequency information (FREQ_INF). For example, when the test signal TEST_EN is composed of a 3-bit signal TEST_EN<0:2>, a least significant bit TEST_EN<0> may become a high level logic during the test operation, and the other two bits TEST_EN<1:2> may have any value of "00", "01" "10" and "11" depending on the frequency information (FREQ_INF). The pattern generator PG may generate the test oscillating signal TOSC which toggles at a set period, according to the frequency information (FREQ_INF) included in the test signal TEST_EN<0:2>. For example, when the test signal TEST_EN<0:2> may have a value of "101", the pattern generator PG may generate the test oscillating signal TOSC which toggles with a first frequency. When the test signal TEST_EN<0:2> may have a value of "110", the pattern generator PG may generate the test oscillating signal TOSC which toggles with a second frequency higher than the first frequency. When test signal TEST_EN<0:2> may have a value of "111", the pattern generator PG may generate the test oscillating signal TOSC which toggles with a third frequency higher than the second frequency. According to an embodiment, the test oscillating signal TOSC may toggle at a set period, or toggle according to a preset pattern.

The first counter CNT1 may count the test oscillating signal TOSC to generate a base counting signal BCNT<0:n>, according to the test signal TEST_EN. For example, the first counter CNT1 may be activated in response to the least significant bit TEST_EN<0>, and count the toggling number of the test oscillating signal TOSC. The first serializer SER1 may serialize the base counting signal BCNT<0:n> to output the test base signal TBASE. The comparator CMP may compare the test core signal TCORE with the test base signal TBASE to output the test output signal TOUT. The test core signal TCORE may be provided through the reference through-electrode REF_TSV.

Further, the first test circuit 450 may include a first register REG1 for storing the base counting signal BCNT<0:n> outputted from the first counter CNT1 to provide the stored base counting signal BCNT<0:n> to the first serializer SER1. In an embodiment, the first register REG1 may store the base counting signal BCNT<0:n> in synchronization with a test clock TCLK.

The cell array area, the I/O sense amplifier 532, and the write driver 534 may be disposed in the core region of the core die 112_x, and the third I/O buffer circuit 510, the read pipe latch 522, the write pipe latch 524, the target through-electrode TSV, and the reference through-electrode REF_TSV may be disposed in the peripheral region of core die 112_x. The second test circuit 550 may be disposed in the TSV area of the peripheral region.

The second test circuit 550 may include a second counter CNT2 and a second serializer SER2.

The second counter CNT2 may count the test oscillating signal TOSC transferred from the input buffer RX3 of the third I/O buffer circuit 510 to generate a core counting signal CCNT<0:n>, according to the test signal TEST_EN. For example, the second counter CNT2 may be activated in response to the least significant bit TEST_EN<0>, and count the toggling number of the test oscillating signal TOSC. The second serializer SER2 may serialize the core counting signal CCNT<0:n> to output the test core signal TCORE to the reference through-electrode REF_TSV.

Further, the second test circuit 550 may include a second register REG2 for storing the core counting signal CCNT<0:n> outputted from the second counter CNT2 to provide the stored core counting signal CCNT<0:n> to the second serializer SER2. In an embodiment, the second register REG2 may store the core counting signal CCNT<0:n> in synchronization with the test clock TCLK. Since the base counting signal BCNT<0:n> and the core counting signal CCNT<0:n> are serialized after storing them in synchronization with the same test dock TCLK, a skew occurred during the signal transmission between the core die 112_x and the base die 114 can be minimized.

A case where the test oscillating signal TOSC is generated inside the base die 114 is explained in the first embodiment. Hereinafter, a case where the test oscillating signal TOSC is inputted from an external test device or generated inside the base die 114 will be explained.

Figure 15:
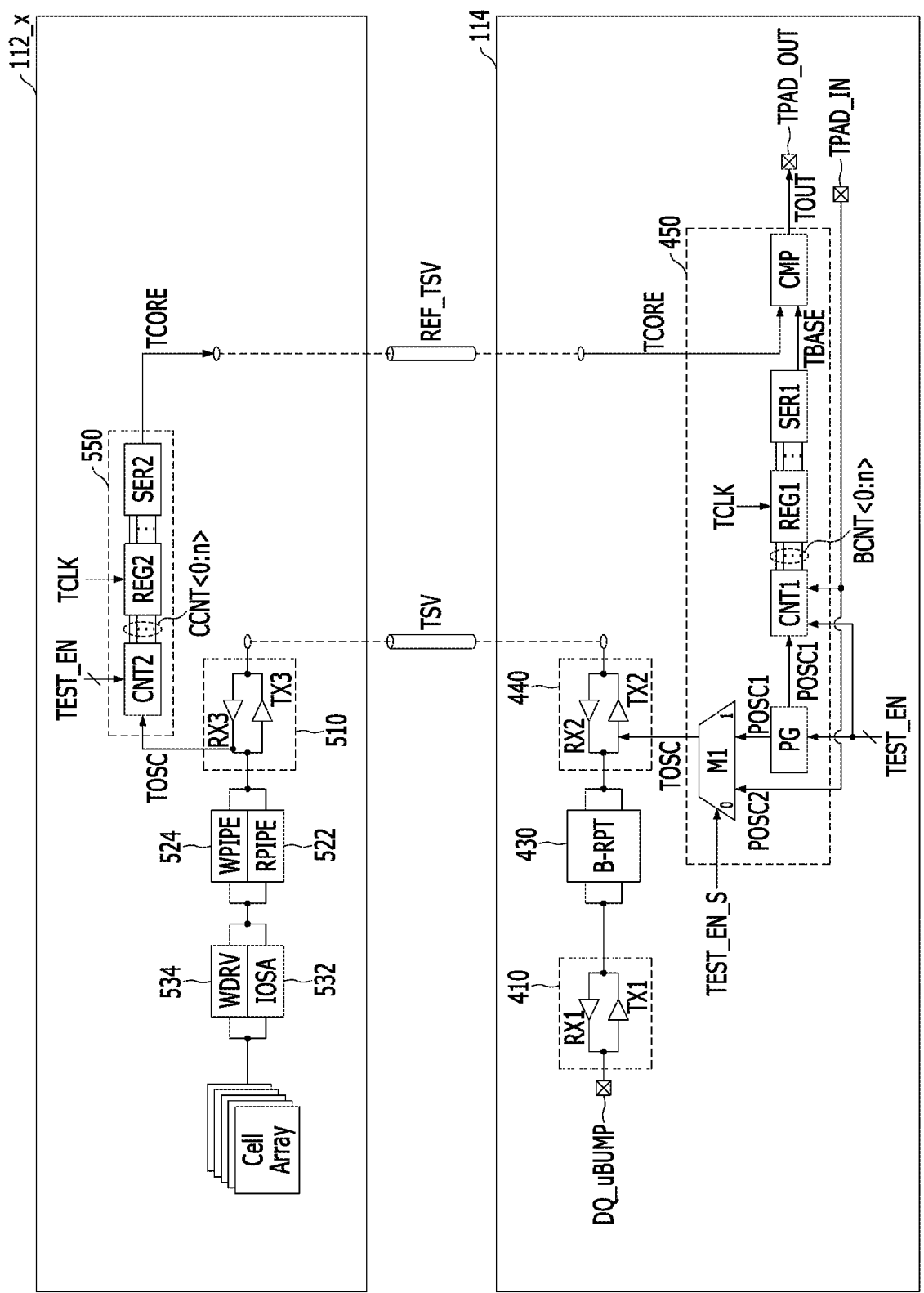
FIG. 15 is a detailed diagram illustrating first and second test circuits of the stacked memory device of FIG. 13, in accordance with a second embodiment of the present invention.

FIG. 15 is a detailed diagram illustrating the first test circuit 450 and the second test circuit 550 of the stacked memory device 110 of FIG. 13, in accordance with a second embodiment of the present invention. In FIGS. 14 and 15, the same composition has been given the same reference numeral and the relevant details are omitted.

Referring to FIG. 15, the first test circuit 450 may include a pattern generator PG, a multiplexer M1, a first counter CNT1, a first register REG1, a first serializer SER1, and a comparator CMP.

The pattern generator PG may generate a first pre-oscillating signal POSC1 according to the test signal TEST_EN. The test signal TEST_EN may be activated during the test operation, and may be a multi-bit signal having frequency information (FREQ_INF). The pattern generator PG may generate the first pre-oscillating signal POSC1 which toggles at a set period, according to the frequency information (FREQ_INF) included in the test signal TEST_EN.

The multiplexer M1 may output a test oscillating signal TOSC to the output buffer TX2 of the second I/O buffer circuit 440 by selecting one of the first and second pre-oscillating signals POSC1 and POSC2 in response to a test selection signal TEST_EN_S. The output buffer TX2 may transfer the test oscillating signal TOSC to the core die 112_x through the target through-electrode TSV. The test selection signal TEST_EN_S may be set to a first logic level (e.g., a low level logic) when receiving the test oscillating signal TOSC from the external test device, and to a second logic level (e.g., a high level logic) when generating the test oscillating signal TOSC inside the base die 114. The second pre-oscillating signal POSC2 may be inputted from the external test device through a test input pad TPAD_IN. For example, the multiplexer M1 may select the first pre-oscillating signal POSC1 in response to the test selection signal TEST_EN_S of a high level logic, and select the second pre-oscillating signal POSC2 in response to the test selection signal TEST_EN_S of a low level logic.

The first counter CNT1 may count the first pre-oscillating signal POSC1 or the second pre-oscillating signal POSC2 to generate a base counting signal BCNT<0:n>, according to the test signal TEST_EN. The first register REG1 may store the base counting signal BCNT<0:n> in synchronization with a test clock TCLK. The first serializer SER1 may serialize the base counting signal BCNT<0:n> stored in the first register REG1 to output the test base signal TBASE. The comparator CMP may compare the test core signal TCORE with the test base signal TBASE to output the test output signal TOUT.

Since the second test circuit 550 of FIG. 15 has substantially the same configuration as the second test circuit 550 of FIG. 14, the detailed description will be omitted.

Figure 16:
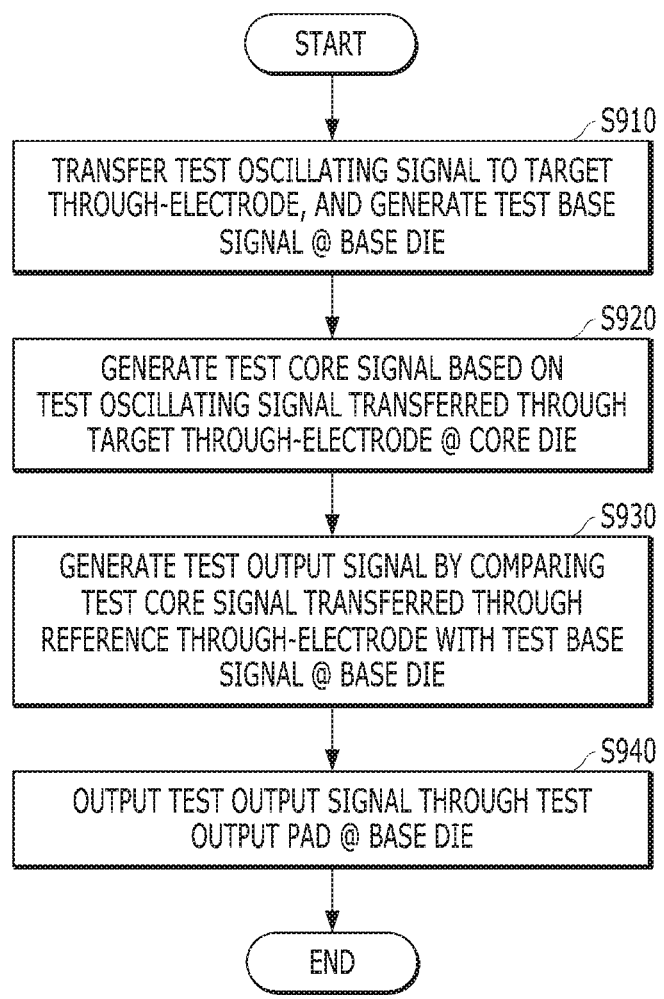
FIG. 16 is a flow chart describing a test operation of a stacked memory device in accordance with an embodiment of the present invention.

FIG. 16 is a flow chart describing a test operation of a stacked memory device in accordance with an embodiment of the present invention.

Referring to FIG. 16, the test operation of the stacked memory device 110 including the base die 114 and the first to fourth core dies 112_0 to 112_3, which are vertically stacked to a substrate through a plurality of through-electrodes TSVs and at least one reference through-electrode REF_TSV, shown in FIGS. 14 and 15, is explained.

The base die 114 may transfer the test oscillating signal TOSC to the target through-electrode TSV among the through-electrodes TSVs, and generate the test base signal TBASE based on the test oscillating signal TOSC (at step S910). In more detail, the first test circuit 450 of the base die 114 may generate the test oscillating signal TOSC which toggles at a set period, according to the frequency information (FREQ_NF) included in the test signal TEST_EN. Alternatively, the first test circuit 450 may generate the test oscillating signal TOSC by receiving the second pre-oscillating signal POSC2 from the external test device through the test input pad TPAD_IN. The first test circuit 450 may generate the test base signal TBASE by counting the test oscillating signal TOSC to generate the base counting signal BCNT<0:n>, storing the base counting signal BCNT<0:n> according to the test clock TCLK, and serializing the stored base counting signal BCNT<0:n>. for reference, in order to minimize the loading effects of the stacked dies and their through-electrode TSV during the test operation, the first test circuit 450 may generate the test oscillating signal TOSC to operate at a lower speed than the transmission speed of normal signals transmitted during a normal operation such as a read or write operation.

The core die 112_x may generate the test core signal TCORE based on the test oscillating signal TOSC transferred through the target through-electrode TSV (at step S920). In more detail, the second test circuit 550 of the core die 112_x may generate the test core signal TCORE by counting the test oscillating signal TOSC to generate the core counting signal CCNT<0:n>, storing the core counting signal CCNT<0:n> according to the test clock TCLK, and serializing the stored core counting signal CCNT<0:n>. At this time, since the base counting signal BCNT<0:n> and the core counting signal CCNT<0:n> are stored at the same time, a skew occurred during the signal transmission between the core die 112_x and the base die 114 can be minimized.

Subsequently, the first test circuit 450 of the base die 114 may output the test output signal TOUT by comparing the test core signal TCORE transferred through the reference through-electrode REF_TSV from the core die 112_x, with the test base signal TBASE (at step S930). The first test circuit 450 may output the test output signal TOUT, through the test output pad TPAD_OUT disposed in the DA area of the base die 114, to the external test device (at step S940).

On the other hand, the external test device may change the frequency information (FREQ_INF) of the test signal TEST_EN. For example, the test device may sequentially change the 3-bit test signal TEST_EN<0:2> into the order of "100", "101", "110", and "111". Alternatively, the test device may sequentially provide the test oscillating signal TOSC through the test input pad TPAD_IN, the test oscillating signal TOSC toggling at any of first to fourth frequencies which are different from each other. The first test circuit 450 of the base die 114 and the second test circuit 550 of the core die 112_x may repeat the above steps S910 to S930, using the test oscillating signal TOSC toggling with the different frequencies. Based on the test output signal TOUT for each frequency, the test device may identify the operational characteristics of the target through-electrode according to the signal transmission rate.

As described above, the test operation of the stacked memory device in accordance with the described embodiments may be performed at the wafer level before the stacked memory device is packaged with the controller. The stacked memory device can accurately determine the signal transmission status of the through-electrodes at the wafer level by testing the through-electrodes using only interface circuits for the through-electrodes. In addition, the test operation of the stacked memory device in accordance with the described embodiments may be performed using the oscillating signal that toggles with the various frequencies to determine the operational characteristics of the through-electrodes according to the signal transmission rate. Therefore, the accuracy and efficiency of signal transmission may be increased, and the overall chip yield may be improved by verifying the signal transmission for the normal operation at the wafer level.

Hereinafter, a method of testing a signal transmission status of through-electrodes TSVs without counting and serializing operations will be explained.

Figure 17:
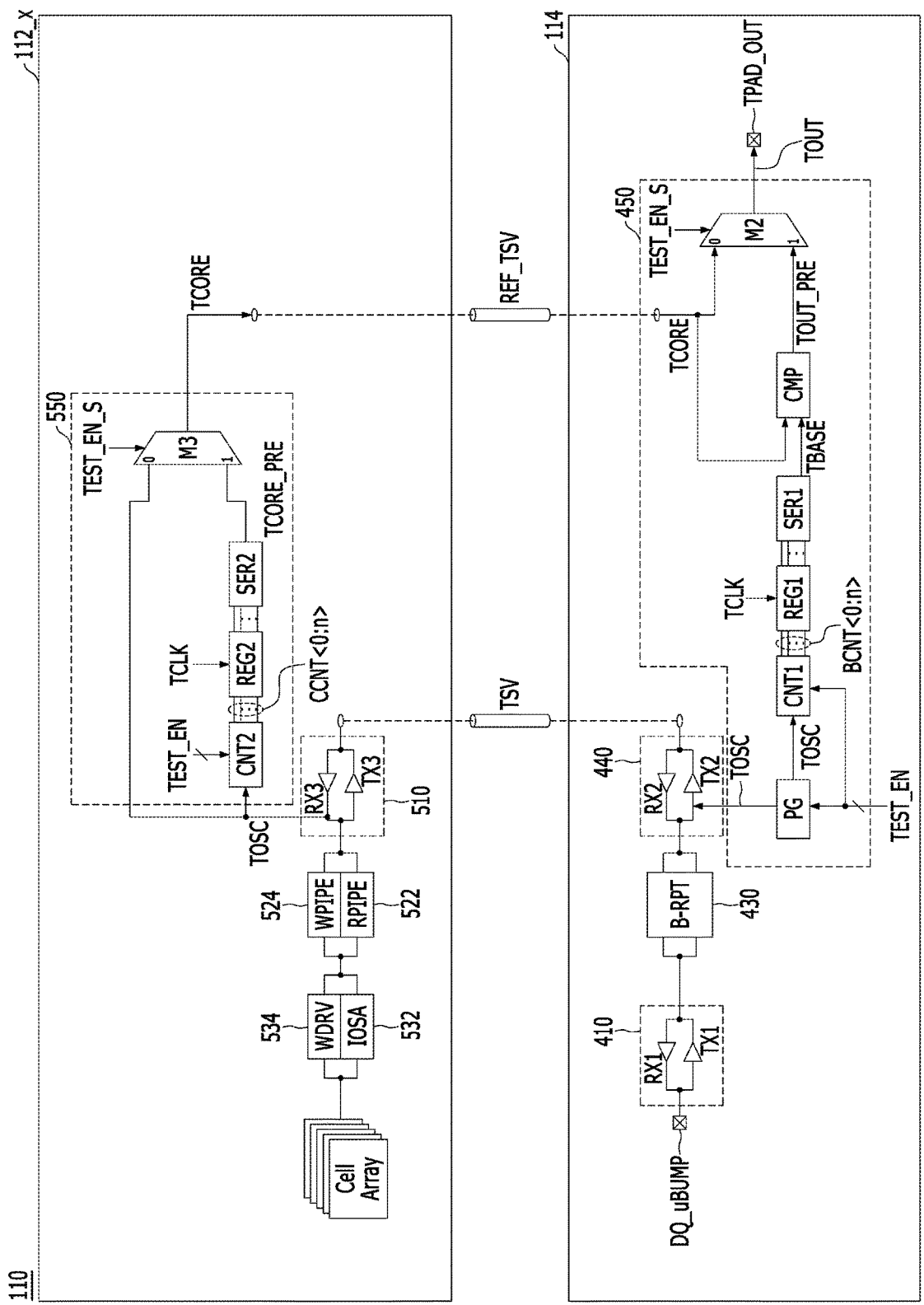
FIG. 17 is a detailed diagram illustrating first and second test circuits of the stacked memory device of FIG. 13, in accordance with a third embodiment of the present invention.

FIG. 17 is a detailed diagram illustrating the first test circuit 450 and the second test circuit 550 of the stacked memory device 110 of FIG. 13, in accordance with a third embodiment of the present invention. In FIGS. 14 and 17, the same composition has been given the same reference numeral and the relevant details are omitted.

Referring to FIG. 17, the first test circuit 450 may include a pattern generator PG, a first counter CNT1, a first register REG1, a first serializer SER1, a comparator CMP and a first multiplexer M2. Since the pattern generator PG, the first counter CNT1, the first register REG1, the first serializer SER1, and the comparator CMP of FIG. 17 have substantially the same configurations as those of FIG. 14, the detailed description will be omitted. The first multiplexer M2 may output a test output signal TOUT by selecting one of a pre-test output signal TOUT_PRE outputted from the comparator CMP, and the test core signal TCORE transferred from the reference through-electrode REF_TSV in response to a test selection signal TEST_EN_S. For example, the first multiplexer M2 may select the test core signal TCORE in response to the test selection signal TEST_EN_S of a low level logic, and select the pre-test output signal TOUT_PRE in response to the test selection signal TEST_EN_S of a high level logic.

The second test circuit 550 may include a second counter CNT2, a second register REG2, a second serializer SER2, and a second multiplexer M3. Since the second counter CNT2, the second register REG2, and the second serializer SER2 of FIG. 17 have substantially the same configurations as those of FIG. 14, the detailed description will be omitted. The second multiplexer M3 may output the test core signal TCORE by selecting one of a pre-test core signal TCORE_PRE outputted from the second serializer SER2, and the test oscillating signal TOSC transferred from the input buffer RX3 of the third I/O buffer circuit 510, in response to the test selection signal TEST_EN_S. The second multiplexer M3 may output the test core signal TCORE to the reference through-electrode REF_TSV. For example, the second multiplexer M3 may select the pre-test core signal TCORE_PRE in response to the test selection signal TEST_EN_S of a high level logic, and select the test oscillating signal TOSC in response to the test selection signal TEST_EN_S of a low level logic.

A test operation of the stacked memory device 110 of FIG. 17 will be explained as follows.

When the test selection signal TEST_EN_S is set to a high level logic, the test operation of the stacked memory device 110 is substantially the same as that of steps in S910 to S940 described in FIG. 16.

When the test selection signal TEST_EN_S is set to a low level logic, the pattern generator PG in the first test circuit 450 of the base die 114 may generate the test oscillating signal TOSC according to the test signal TEST_EN, and provide it to the output buffer TX2 of the second I/O buffer circuit 440. The second multiplexer M3 in the second test circuit 550 of the core die 112_x may output the test core signal TCORE to the reference through-electrode REF_TSV by selecting the test oscillating signal TOSC. The first multiplexer M2 may output the test output signal TOUT by selecting the test core signal TCORE transferred through the reference through-electrode REF_TSV. The test output signal TOUT may be outputted to the external test device through the test output pad TPAD_OUT disposed in the DA area of the base die 114.

Hereinafter, a method of testing a signal transmission status of a plurality of through-electrodes TSVs using one reference through-electrode REF_TSV will be explained.

Figure 18:
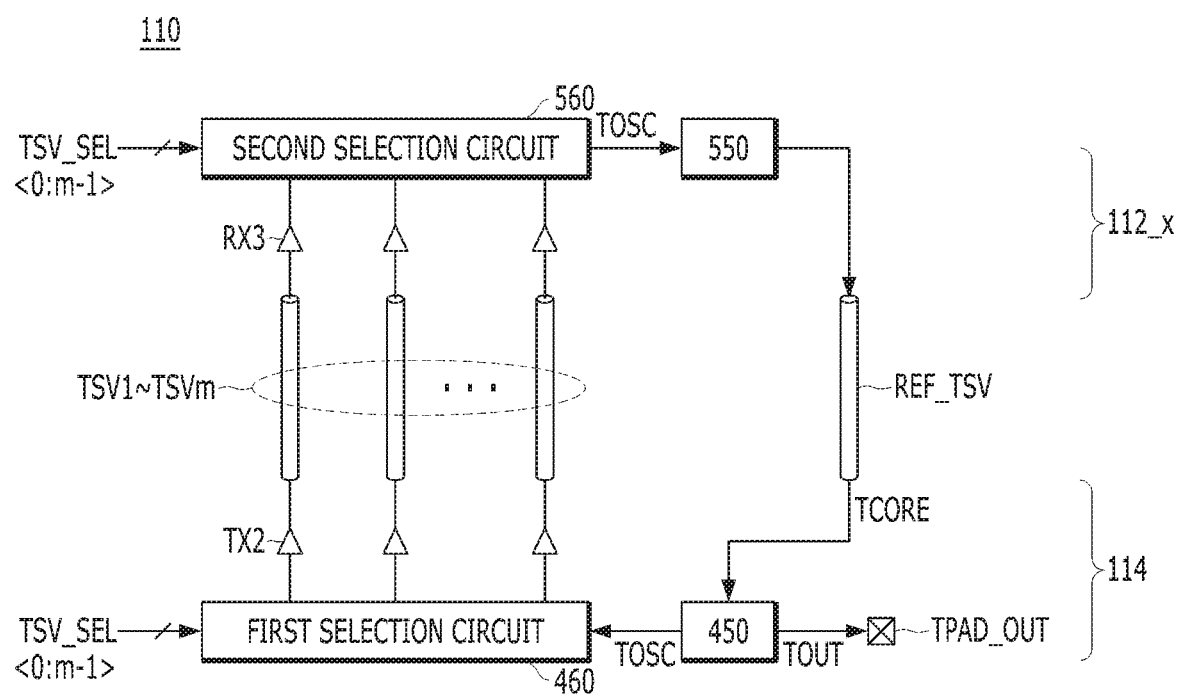
FIG. 18 is a diagram illustrating a configuration of a stacked memory device in accordance with an embodiment of the present invention.

FIG. 18 is a diagram illustrating a configuration of the stacked memory device 110 in accordance with an embodiment of the present invention. FIG. 18 illustrates only a configuration required for testing the stacked memory device 110, among the configurations of FIG. 13, and omit the description of the remaining configurations.

Referring to FIG. 18, the base die 114 may include a first test circuit 450 and a first selection circuit 460, and the core die 112_x may include a second test circuit 550 and a second selection circuit 560. The first test circuit 450 and the second test circuit 550 of FIG. 18 may be substantially the same as the configuration of any of FIGS. 14, 15 and 17.

The first test circuit 450 may provide the test oscillating signal TOSC to the first selection circuit 460. The first selection circuit 460 may select one of first to m-th target through-electrodes TSV1 to TSVm according to a through-electrode selection signal TSV_SEL<0:m−1>, and provide the test oscillating signal TOSC provided from the first test circuit 450 to the output buffer TX2 coupled to the selected target through-electrode.

The second selection circuit 560 may select one of the first to m-th target through-electrodes TSV1 to TSVm according to the through-electrode selection signal TSV_SEL<0:m−1>, and provide the test oscillating signal TOSC transferred through the input buffer RX3 coupled to the selected target through-electrode to the second test circuit 550.

In a test operation of the stacked memory device 110 of FIG. 17, the first target through-electrode TSV1 is selected in response to an activation of a first bit TSV_SEL<0> of the through-electrode selection signal TSV_SEL<0:m−1>, and steps S910 to S940 as described in FIG. 16 may be performed. At this time, steps S910 to S940 may be repeated as the frequency information (FREQ_INF) of the test signal TEST_EN changes. Based on the test output signal TOUT for each frequency, the test device may identify the operational characteristics of the target through-electrode according to the signal transmission rate.

Subsequently, as each bit of the through-electrode selection signal TSV_SEL<0:m−1> is activated sequentially, the second to m-th target through-electrodes TSV2 to TSVm may be selected sequentially, and steps S910 to S940 may be performed. Similarly, as the frequency information (FREQ_INF) of the test signal TEST_EN changes, steps S910 to S940 are performed repeatedly so that the test device may identify the operational characteristics of the target through-electrode according to the signal transmission rate based on the test output signal TOUT for each frequency.

As described above, the characteristics of a number of through-electrodes may be monitored through a single reference through-electrode. That is, by monitoring the characteristics of a number of through-electrodes on a unified basis, the operational characteristics of the through-electrodes according to the signal transmission rate can be more accurately identified.

In accordance with an embodiment of the present invention, the staked semiconductor device can improve the overall chip yield by verifying whether the through-electrodes are operating normally, at a wafer level before the stacked semiconductor device is packaged with the controller. Further, the staked semiconductor device can increase the accuracy and efficiency of a signal transmission by identifying the operational characteristics of the through-electrodes according to the signal transmission rate. Further, the staked semiconductor device can accurately determine the signal transmission status of through-electrodes by testing only the through-electrodes and interface circuits therefor.

Although various embodiments have been described for illustrative purposes, it will be apparent to those skilled in the art that various changes and modifications may be made without departing from the spirit and scope of the invention as defined in the following claims.

For example, the logic gates and transistors illustrated in the above embodiments may have different positions and types according to the polarity of input signals.

What is claimed is:
1. A stacked semiconductor device, comprising:
a base die; and
a plurality of core dies stacked over the base die and coupled to each other through a plurality of through-electrodes and a reference through-electrode,
wherein the base die includes a first test circuit suitable for transferring a test oscillating signal to at least one target through-electrode among the through-electrodes, and outputting a test output signal by comparing a test base signal generated based on the test oscillating signal, with a test core signal transferred through the reference through-electrode, during a test operation; and
wherein each of the core dies includes a second test circuit suitable for generating the test core signal corresponding to the test oscillating signal transferred through the target through-electrode, and transferring the test core signal to the reference through-electrode, during the test operation.

2. The stacked semiconductor device of claim 1,
wherein the base die includes a first area suitable for interfacing with a controller, a second area suitable for interfacing with the through-electrodes, and a third area suitable for interfacing with a test device, and
wherein the first test circuit is disposed in the second area.

3. The stacked semiconductor device of claim 2, wherein the first test circuit outputs the test output signal to outside through a test output pad disposed in the third area.

4. The stacked semiconductor device of claim 2, wherein the base die includes:

a first input/output (I/O) buffer circuit disposed in the first area, and suitable for receiving and outputting data transferred from/to the controller; and
a second I/O buffer circuit disposed in the second area, and suitable for receiving and outputting data transferred from/to the through-electrodes.

5. The stacked semiconductor device of claim 4, wherein the first test circuit includes:
a pattern generator suitable for generating and providing the test oscillating signal to an output buffer of the second I/O buffer circuit, according to a test signal;
a first counter suitable for counting the test oscillating signal to generate a base counting signal according to the test signal;
a first serializer suitable for serializing the base counting signal to output the test base signal; and
a comparator suitable for comparing the test core signal with the test base signal to output the test output signal.

6. The stacked semiconductor device of claim 5,
wherein the test signal includes a multi-bit signal having frequency information, and
wherein the pattern generator generates the test oscillating signal which toggles at a set period, according to the frequency information included in the test signal.

7. The stacked semiconductor device of claim 5, wherein the first test circuit further includes:
a first register suitable for storing the base counting signal outputted from the first counter to provide the stored base counting signal to the first serializer.

8. The stacked semiconductor device of claim 4, wherein the first test circuit includes:
a pattern generator suitable for generating a first pre-oscillating signal according to a test signal;
a multiplexer suitable for outputting the oscillating signal to an output buffer of the second I/O buffer circuit by selecting one of the first pre-oscillating signal and a second pre-oscillating signal in response to a test selection signal;
a first counter suitable for counting the first pre-oscillating signal or the second pre-oscillating signal to generate a base counting signal according to the test signal;
a first serializer suitable for serializing the base counting signal to output the test base signal; and
a comparator suitable for comparing the core signal with the test base signal to output the test output signal.

9. The stacked semiconductor device of claim 8, wherein the first test circuit further includes:
a first register suitable for storing the base counting signal outputted from the first counter to provide the stored base counting signal to the first serializer.

10. The stacked semiconductor device of claim 1, wherein each of the core dies includes:
a core region including a plurality of memory cells; and
a peripheral region including a peripheral circuit for controlling components disposed in the core region, an interface circuit for interfacing with the through-electrodes, and the through-electrodes TSV.

11. The stacked semiconductor device of claim 10, wherein each of the core dies includes:
a third I/O buffer circuit disposed in the peripheral region, and suitable for receiving and outputting data transferred from/to the through-electrodes.

12. The stacked semiconductor device of claim 11, wherein the second test circuit includes:

a second counter suitable for counting the test oscillating signal transferred from an input buffer of the third I/O buffer circuit to generate a core counting signal, according to a test signal; and a second serializer suitable for serializing the core counting signal to output the test core signal to the reference through-electrode.

13. The stacked semiconductor device of claim 12, wherein the second test circuit further includes:

a second register suitable for storing the core counting signal outputted from the second counter to provide the stored core counting signal to the second serializer.

14. The stacked semiconductor device of claim 11, wherein each of the core dies further includes:

a write driver suitable for writing data transferred from the third I/O buffer circuit into the memory cells during a write operation; and an I/O sense amplifier suitable for sensing and amplifying data outputted from the memory cells to transfer the amplified data to the third I/O buffer circuit during a read operation.

15. A test method of a stacked semiconductor device including a base die and a plurality of core dies stacked over the base die and coupled to each other through a plurality of through-electrodes and a reference through-electrode, the test operation comprising:

transferring, at the base die, a test oscillating signal to a target through-electrode among the through-electrodes, and generating a test base signal based on the oscillating signal;

generating, at any of the core die, a test core signal based on the test oscillating signal transferred through the target through-electrode; and outputting, at the base die, a test output signal by comparing the test core signal transferred through the reference through-electrode, with the test base signal.

16. The test method of claim 15, wherein the base die includes a first area suitable for interfacing with a controller, a second area suitable for interfacing with the through-electrodes, and a third area suitable for interfacing with a test device, and further comprising:

outputting, at the base die, the test output signal to the test device through a test output pad disposed in the third area.

17. The test method of claim 16, wherein the oscillating signal is inputted from the test device through a test input pad disposed in the third area.

18. The test method of claim 15, wherein the based die generates the test oscillating signal according to a test signal including a multi-bit signal having frequency information, the test oscillating signal toggling with a set period, according to the frequency information included in the test signal.

19. The test method of claim 15, wherein the generating a base signal based on the oscillating signal includes:

counting the test oscillating signal to generate a base counting signal according to a test signal;

storing the base counting signal; and serializing the stored base counting signal to output the test base signal.

20. The test method of claim 15, wherein the generating a test core signal based on the test oscillating signal includes:

counting the test oscillating signal to generate a core counting signal, according to a test signal;

storing the core counting signal; and serializing the core counting signal to output the test core signal to the reference through-electrode.

* * * * *